US011444147B2

(12) United States Patent
Choi et al.

(10) Patent No.: US 11,444,147 B2
(45) Date of Patent: Sep. 13, 2022

(54) DISPLAY DEVICE

(71) Applicant: Samsung Display Co., LTD., Yongin-si (KR)

(72) Inventors: Min Hee Choi, Hwaseong-si (KR); Ji-Eun Lee, Seoul (KR); Jin Tae Jeong, Suwon-si (KR); Yun Sik Joo, Goyang-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 0 days.

(21) Appl. No.: 17/245,576

(22) Filed: Apr. 30, 2021

(65) Prior Publication Data

US 2021/0376051 A1  Dec. 2, 2021

(30) Foreign Application Priority Data

Jun. 2, 2020 (KR) .................. 10-2020-0066617

(51) Int. Cl.
*H01L 27/32* (2006.01)
*G09G 3/3258* (2016.01)
(Continued)

(52) U.S. Cl.
CPC ....... *H01L 27/3279* (2013.01); *G09G 3/3258* (2013.01); *G09G 3/3233* (2013.01);
(Continued)

(58) Field of Classification Search
CPC .................. H01L 27/3279; G09G 3/3258; G09G 3/3233; G09G 3/3659; G09G 2300/0426;
(Continued)

(56) References Cited

U.S. PATENT DOCUMENTS 6,066,860 A * 5/2000 Katayama ............... H01L 27/12
257/E29.151
6,605,827 B2 * 8/2003 Katayama ............... H01L 27/12
349/44
(Continued)

FOREIGN PATENT DOCUMENTS

KR          10-1015885          2/2011
KR      10-2018-0024817         3/2018
(Continued)

*Primary Examiner* — Tom V Sheng
(74) *Attorney, Agent, or Firm* — Kile Park Reed & Houtteman PLLC

(57) ABSTRACT

A display device includes a light emitting diode electrically connected between a driving voltage line and a common voltage line; a driving transistor electrically connected between the driving voltage line and the light emitting diode; a second transistor electrically connected between a first electrode of the driving transistor electrically connected to the driving voltage line and a data line; a first scan line electrically connected to a gate electrode of the second transistor; a third transistor electrically connected between a second electrode of the driving transistor electrically connected to the light emitting diode and a gate electrode of the driving transistor; and a connection electrode that connects the gate electrode of the driving transistor and the third transistor, wherein at least a part of a contact portion where the connection electrode contacts the third transistor does not overlap the first scan line.

22 Claims, 19 Drawing Sheets

(51) Int. Cl.
 *G09G 3/3233* (2016.01)
 *G09G 3/36* (2006.01)
(52) U.S. Cl.
 CPC ..... *G09G 3/3659* (2013.01); *G09G 2300/043* (2013.01); *G09G 2300/0426* (2013.01); *G09G 2300/0809* (2013.01); *G09G 2300/0819* (2013.01); *G09G 2300/0842* (2013.01); *G09G 2310/0202* (2013.01); *G09G 2310/0254* (2013.01)
(58) Field of Classification Search
 CPC ..... G09G 2300/043; G09G 2300/0842; G09G 2300/0809; G09G 2300/0819; G09G 2310/0202; G09G 2310/0254
 USPC ........................................... 257/71
 See application file for complete search history.

(56) References Cited

U.S. PATENT DOCUMENTS

| | | | |
|---|---|---|---|
| 9,373,281 B2 | 6/2016 | Wu et al. | |
| 2012/0127220 A1* | 5/2012 | Noguchi | G09G 3/3233 345/77 |
| 2012/0206658 A1* | 8/2012 | Yoshida | H01L 27/1255 257/E27.06 |
| 2014/0111406 A1* | 4/2014 | Wang | G09G 3/3233 345/77 |
| 2014/0146094 A1* | 5/2014 | Koide | G09G 3/3648 345/87 |
| 2014/0253533 A1* | 9/2014 | Miyake | G09G 3/3655 345/212 |
| 2014/0313446 A1* | 10/2014 | Kubota | G02F 1/1368 257/59 |
| 2017/0170200 A1* | 6/2017 | Ikeda | H01L 27/3276 |
| 2017/0330929 A1* | 11/2017 | Park | H01L 27/3276 |
| 2018/0061317 A1* | 3/2018 | Morita | H01L 27/1225 |
| 2018/0107041 A1* | 4/2018 | Hayashi | G02F 1/13454 |
| 2018/0114491 A1* | 4/2018 | Tokuda | H01L 51/0097 |
| 2018/0252970 A1* | 9/2018 | Iwakabe | G09G 3/001 |
| 2020/0185481 A1* | 6/2020 | Park | H01L 27/3265 |
| 2021/0249498 A1* | 8/2021 | Cho | H01L 27/124 |

FOREIGN PATENT DOCUMENTS

| | | |
|---|---|---|
| KR | 10-2021-0013460 | 2/2021 |
| KR | 10-2021-0101378 | 8/2021 |

* cited by examiner

DISPLAY DEVICE

CROSS-REFERENCE TO RELATED APPLICATION

This U.S. non-provisional application claims priority to and the benefit of Korean Patent Application No. 10-2020-0066617 under 35 U.S.C. § 119, filed in the Korean Intellectual Property Office (KIPO) on Jun. 2, 2020, the entire contents of which are incorporated herein by reference.

BACKGROUND

1. Technical Field

The disclosure relates to a display device.

2. Description of the Related Art

An organic light emitting device includes an organic emission layer disposed between two electrodes, and electrons injected from one electrode are combined with holes injected from the other electrode in an organic emission layer to form excitons. The excitons output energy and emit light when they transition from an excited state to a ground state.

The organic light emitting device includes multiple pixels, each of which includes an organic light emitting diode (a self-luminous device), and multiple transistors, and at least one capacitor for driving the organic light emitting diode. The transistors include a switching transistor and a driving transistor.

Each pixel may also include a transistor for transmitting a compensation voltage. In case that the compensation voltage transfer route overlaps other wires, resistance may increase, and the compensation voltage may not be properly transmitted. This may cause horizontal line defects e.g., horizontal stains.

The information disclosed in this Background section is provided to enhance understanding of the background of the described technology. It may contain information that is not part of the prior art that is already known to a person of ordinary skill in the art.

SUMMARY

The disclosure has been made in an effort to provide a display device for smoothly transmitting a compensation voltage by reducing a resistance of a compensation voltage transfer route.

The described technology has been made in another effort to provide a display device for reducing horizontal line defects.

An embodiment provides a display device including a light emitting diode electrically connected between a driving voltage line that applies a driving voltage and a common voltage line that applies a common voltage; a driving transistor electrically connected between the driving voltage line and the light emitting diode; a second transistor electrically connected between a first electrode of the driving transistor electrically connected to the driving voltage line and a data line that applies a data voltage; a first scan line electrically connected to a gate electrode of the second transistor; a third transistor electrically connected between a second electrode of the driving transistor electrically connected to the light emitting diode and a gate electrode of the driving transistor; a connection electrode that electrically connects the gate electrode of the driving transistor and the third transistor; and a contact portion where the connection electrode electrically contacts the third transistor. At least a part of the contact portion may not overlap the first scan line.

In an embodiment, the contact portion may not overlap the first scan line.

In an embodiment, the third transistor may include a first electrode electrically connected to a first electrode of the driving transistor; a second electrode electrically connected to the connection electrode; a channel disposed between the first electrode and the second electrode; and a gate electrode overlapping the channel. The second electrode of the third transistor may overlap the connection electrode.

In an embodiment, the display device may further include an insulating layer disposed between the second electrode of the third transistor and the connection electrode. The insulating layer may include an opening overlapping the second electrode of the third transistor and the connection electrode, the second electrode of the third transistor may be electrically connected to the connection electrode through the opening, and the opening may not overlap the first scan line.

In an embodiment, the contact portion may be disposed in the opening.

In an embodiment, the display device may further include a second scan line electrically connected to the gate electrode of the third transistor. The opening may be disposed between the first scan line and the second scan line in a plan view.

In an embodiment, a side edge of the opening may correspond to a side edge of the first scan line.

In an embodiment, the connection electrode may overlap the first scan line.

In an embodiment, the opening may be separated from the first scan line.

In an embodiment, the connection electrode may not overlap the first scan line.

In an embodiment, the driving transistor and the second transistor may include polycrystalline semiconductors and may be p-type transistors, and the third transistor may include an oxide semiconductor and may be an n-type transistor.

In an embodiment, voltages having opposite polarities may be applied to the first scan line and the second scan line, respectively, at a same time.

In an embodiment, the display device may further include a boost capacitor electrically connected between the gate electrode of the second transistor and the second electrode of the third transistor. The contact portion may not overlap the boost capacitor.

In an embodiment, the contact portion may include a first part that overlaps the first scan line, a second part that does not overlap the first scan line, and the second part is a remaining area of the contact portion other than the first part.

In an embodiment, the third transistor may include a first electrode electrically connected to the first electrode of the driving transistor; a second electrode electrically connected to the connection electrode; a channel disposed between the first electrode and the second electrode; and a gate electrode overlapping the channel. The second electrode of the third transistor may overlap the connection electrode.

In an embodiment, the display device may further include an insulating layer disposed between the second electrode of the third transistor and the connection electrode. The insulating layer may include an opening overlapping the second electrode of the third transistor and the connection electrode, the second electrode of the third transistor may be electrically connected to the connection electrode through the opening, and the opening may include a first part that overlaps the first scan line, and a second part that does not overlap the first scan line, the second part being a remaining portion of the opening other than the first part.

In an embodiment, the contact portion may be disposed in the opening.

In an aspect, an embodiment provides a display device including a driving transistor including a first electrode, a channel, and a second electrode disposed on a substrate, the driving transistor including a polycrystalline semiconductor; a first gate insulating layer disposed on the first electrode, the channel, and the second electrode of the driving transistor; a gate electrode of the driving transistor disposed on the first gate insulating layer and overlapping the channel of the driving transistor; a first scan line disposed on the first gate insulating layer; a second gate insulating layer disposed on the gate electrode of the driving transistor and the first scan line; a lower second scan line disposed on the second gate insulating layer; a first interlayer insulating layer disposed on the lower second scan line; a third transistor including a first electrode, a channel, and a second electrode, the third transistor being disposed on the first interlayer insulating layer and including an oxide semiconductor; a third gate insulating layer disposed on the first electrode, the channel, and the second electrode of the third transistor; a gate electrode of the third transistor disposed on the third gate insulating layer; a second interlayer insulating layer disposed on the gate electrode of the third transistor; a connection electrode disposed on the second interlayer insulating layer and electrically connecting the gate electrode of the driving transistor and the second electrode of the third transistor; and a contact portion where the connection electrode electrically contacts the second electrode of the third transistor. At least a part of the contact portion may not overlap the lower second scan line.

In an embodiment, the second interlayer insulating layer and the third gate insulating layer may include an opening overlapping the connection electrode and the second electrode of the third transistor, the contact portion may be disposed in the opening, and at least a part of the opening may not overlap the first scan line.

In an embodiment, the display device may further include an upper second scan line, the upper second scan line and the gate electrode of the third transistor being integral with each other. The opening may be disposed between the first scan line and the upper second scan line in a plan view, and the opening may not overlap the upper second scan line.

In an embodiment, the display device may further include a second transistor electrically connected to the first scan line, wherein the driving transistor and the second transistor may include polycrystalline semiconductors and may be p-type transistors, the third transistor may include an oxide semiconductor and may be an n-type transistor, and voltages having opposite polarities may be applied to the first scan line and the second scan line, respectively, at a same time.

In an embodiment, The display device may further include a first boost electrode, the first boost electrode and the first scan line being integral with each other, a second boost electrode, the second boost electrode and the second electrode of the third transistor being integral with each other, wherein the first boost electrode may overlap the second boost electrode with the second gate insulating layer and the first interlayer insulating layer being disposed between the first boost electrode and the second boost electrode to form a boost capacitor, and at least a part of the contact portion may not overlap the boost capacitor.

According to embodiments, the compensation voltage may be smoothly transmitted by reducing resistance on the compensation voltage transfer route CTR, thereby reducing the horizontal line defects on a display device.

BRIEF DESCRIPTION OF THE DRAWINGS

An additional appreciation according to the embodiments of the disclosure will become more apparent by describing in detail some embodiments thereof with reference to the accompanying drawings, wherein.

DETAILED DESCRIPTION OF THE EMBODIMENTS

Figure 1:
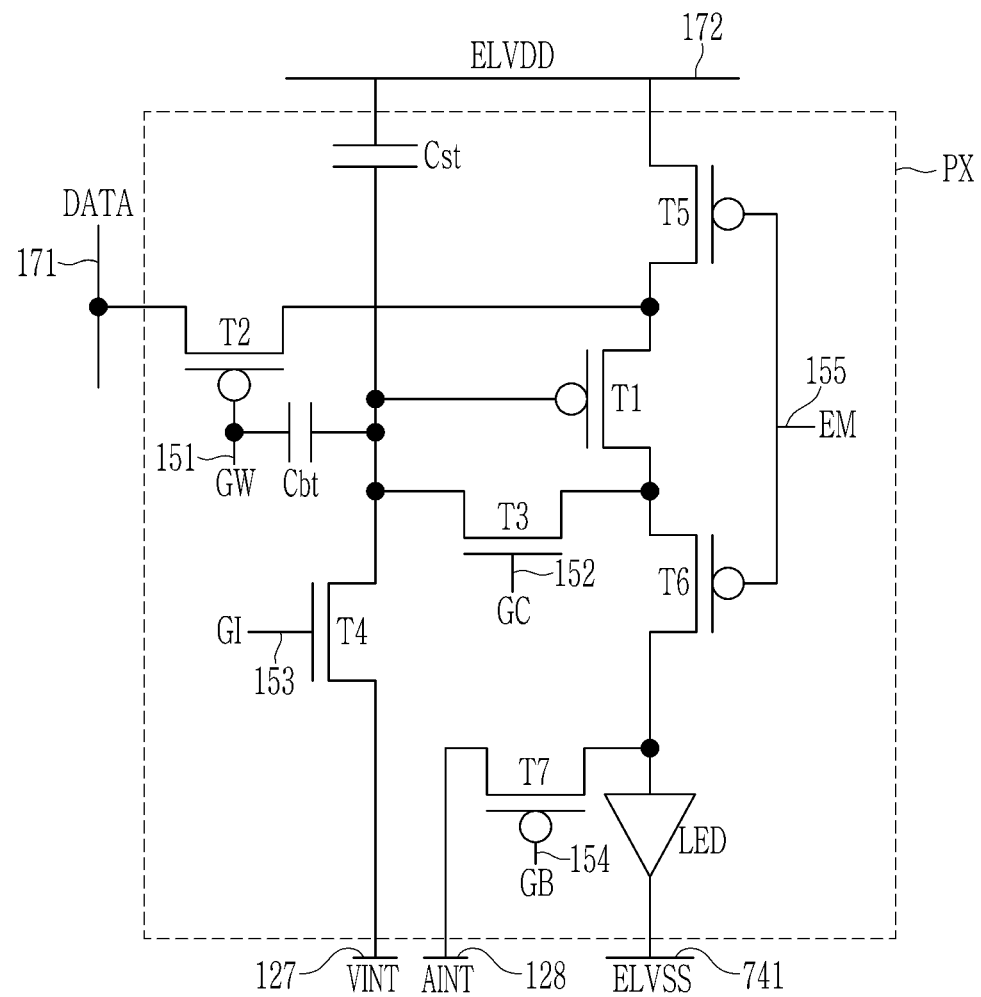
FIG. 1 shows a schematic circuit diagram of a display device according to an embodiment.

Since the disclosure may have diverse modified embodiments, some embodiments are illustrated in the drawings and are described in the detailed description of the disclosure. However, this does not limit the disclosure within specific embodiments and it should be understood that the disclosure covers all the modifications, equivalents, and replacements within the idea and technical scope of the disclosure.

Parts that are irrelevant to the description may be omitted to clearly describe the disclosure, and the same elements will be designated by the same reference numerals throughout the specification.

The thicknesses of some layers and areas may be exaggerated for convenience of explanation. In the drawings, the thickness of layers, films, panels, regions, etc., may be exaggerated for clarity. The thicknesses of some layers and areas are exaggerated for convenience of explanation.

It will be understood that when an element such as a layer, film, region, or substrate is referred to as being "on," "connected to," or "coupled to" another element, it can be directly on, or connected or coupled to the another element or intervening elements may also be present. In contrast, when an element is referred to as being "directly on" another element, there are no intervening elements present. The word "on" or "above" means positioned on or below the object portion and does not necessarily mean positioned on the upper side of the object portion based on a gravitational direction.

Unless explicitly described to the contrary, the word "comprise" or "include" and variations such as "comprises" "comprising," or "including" will be understood to imply the inclusion of stated elements but not the exclusion of any other elements.

The phrase "in a plan view" means viewing an object portion from the top, and the phrase "in a cross-sectional view" means viewing a cross-section of which the object portion is vertically cut from the side.

As used herein, the term "and/or" includes any and all combinations of one or more of the associated listed items. For example, "A and/or B" may be understood to mean "A, B, or A and B."

It will be understood that, although the terms "first," "second," etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the scope of the claims. The singular forms, "a," "an" and "the" are intended to include the plural forms as well, unless referred to the contrary.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

In the specification and the claims, the phrase "at least one of" is intended to include the meaning of "at least one selected from the group of" for the purpose of its meaning and interpretation. For example, "at least one of A and B" may be understood to mean "A, B, or A and B."

Hereinafter, a display device according to an embodiment of the disclosure will be explained in detail with reference to the accompanying drawings.

A pixel PX of a display device according to an embodiment will be described with reference to FIG. 1.

FIG. 1 shows a schematic circuit diagram of a display device according to an embodiment.

As shown in FIG. 1, the pixel PX of the display device includes multiple transistors T1, T2, T3, T4, T5, T6, and T7, electrically connected to wires 127, 128, 151, 152, 153, 154, 155, 171, 172, and 741, a storage capacitor Cst, a boost capacitor Cbt, and a light emitting diode LED.

The wires include a first initialization voltage line 127, a second initialization voltage line 128, a first scan line 151, a second scan line 152, an initialization control line 153, a bypass control line 154, an emission control line 155, a data line 171, a driving voltage line 172, and a common voltage line 741.

The first scan line 151 is electrically connected to a gate driver (not shown) to transmit a first scan signal GW to the second transistor T2. Voltages having opposite polarities may be applied to the first scan line 151 and second scan line 152, respectively, at the same time. For example, when a negative voltage is applied to the first scan line 151, a positive voltage may be applied to the second scan line 152. The second scan line 152 transmits a second scan signal GC to the third transistor T3.

The initialization control line 153 transmits an initialization control signal GI to the fourth transistor T4. The bypass control line 154 transmits a bypass signal GB to the seventh transistor T7. The bypass control line 154 may be electrically connected to a first scan line 151 at a previous stage (or of a previous pixel). The emission control line 155 transmits an emission control signal EM to the fifth transistor T5 and the sixth transistor T6.

The data line 171 transmits a data voltage DATA generated by a data driver (not shown). The luminance of light emitted by the light emitting diode (LED) may be dependent on the data voltage DATA applied to the pixel PX.

The driving voltage line 172 applies a driving voltage ELVDD. The first initialization voltage line 127 transmits a first initialization voltage VINT, and the second initialization voltage line 128 transmits a second initialization voltage AINT. The common voltage line 741 applies a common voltage ELVSS to a cathode of the light emitting diode LED. In an embodiment, constant voltages may be applied to the driving voltage line 172, the first and second initialization voltage lines 127 and 128, and the common voltage line 741.

A configuration and a connection relationship of transistors will now be described in detail.

The driving transistor T1 may have p-type transistor characteristics and may include a polycrystalline semiconductor. The driving transistor T1 controls a current provided to an anode of the light emitting diode LED according to the data voltage DATA applied to the gate electrode of the driving transistor T1. Brightness of the light emitting diode LED is controlled by the driving current provided to the anode of the light emitting diode LED, so luminance of the light emitting diode LED may be controlled according to the data voltage DATA applied to the pixel PX. For this purpose, a first electrode of the driving transistor T1 is disposed to receive a driving voltage ELVDD through the fifth transistor T5 and is electrically connected to the driving voltage line 172. The first electrode of the driving transistor T1 is electrically connected to a second electrode of the second transistor T2 to receive the data voltage DATA. A second electrode of the driving transistor T1 is disposed to provide a current to the light emitting diode LED through the sixth transistor T6, and is electrically connected to the anode of the light emitting diode LED. The second electrode of the driving transistor T1 transmits the data voltage DATA applied to the first electrode to the third transistor T3. A gate electrode of the driving transistor T1 is electrically connected to an electrode (hereinafter, "second storage electrode") of the storage capacitor Cst. The voltage at the gate electrode of the driving transistor T1 changes according to a voltage stored in the storage capacitor Cst, and a driving current output by the driving transistor T1 accordingly changes. The storage capacitor Cst also maintains the voltage at the gate electrode of the driving transistor T1 for a frame.

The second transistor T2 may have p-type transistor characteristics and may include a polycrystalline semiconductor. The second transistor T2 receives the data voltage DATA into the pixel PX. A gate electrode of the second transistor T2 is electrically connected to the first scan line 151 and an electrode (hereinafter, "first boost electrode") of the boost capacitor Cbt. A first electrode of the second transistor T2 is electrically connected to the data line 171. A second electrode of the second transistor T2 is electrically connected to the first electrode of the driving transistor T1. In case that the second transistor T2 is turned on by a negative voltage of the first scan signal GW transmitted through the first scan line 151, the data voltage DATA transmitted through the data line 171 is transmitted to the first electrode of the driving transistor T1.

The third transistor T3 may have n-type transistor characteristics and may include an oxide semiconductor. The third transistor T3 electrically connects the second electrode and the gate electrode of the driving transistor T1 to each other. The third transistor T3 transmits the compensation voltage that is changed in case that the data voltage (DATA) passes through the driving transistor T1 to the second storage electrode of the storage capacitor Cst. A gate electrode of the third transistor T3 is electrically connected to the second scan line 152, and the first electrode of the third transistor T3 is electrically connected to the second electrode of the driving transistor T1. A second electrode of the third transistor T3 is electrically connected to a second storage electrode of the storage capacitor Cst, a gate electrode of the driving transistor T1, and another electrode (hereinafter, the second boost electrode) of the boost capacitor Cbt. The third transistor T3 is turned on by a positive voltage of the second scan signal GC received through the second scan line 152 to electrically connect the gate electrode and the second electrode of the driving transistor T1 to each other, and transmits the voltage applied to the gate electrode of the driving transistor T1 to the second storage electrode of the storage capacitor Cst to store the voltage in the storage capacitor Cst.

The fourth transistor T4 may have n-type transistor characteristics and may include an oxide semiconductor. The fourth transistor T4 initializes the gate electrode of the driving transistor T1 and the second storage electrode of the storage capacitor Cst. A gate electrode of the fourth transistor T4 is electrically connected to the initialization control line 153, and a first electrode of the fourth transistor T4 is electrically connected to the first initialization voltage line 127. A second electrode of the fourth transistor T4 is electrically connected to the second electrode of the third transistor T3, the second storage electrode of the storage capacitor Cst, the gate electrode of the driving transistor T1, and the second boost electrode of the boost capacitor Cbt. The fourth transistor T4 is turned on by a positive voltage of the initialization control signal GI received through the initialization control line 153, and in this instance, transmits the first initialization voltage VINT to the gate electrode of the driving transistor T1 and the second storage electrode of the storage capacitor Cst. Accordingly, the voltage at the gate electrode of the driving transistor T1 and the storage capacitor Cst are initialized.

The fifth transistor T5 may be a p-type transistor and may include a polycrystalline semiconductor. The fifth transistor T5 transmits the driving voltage ELVDD to the driving transistor T1. A gate electrode of the fifth transistor T5 is electrically connected to the emission control line 155, a first electrode of the fifth transistor T5 is electrically connected to the driving voltage line 172, and a second electrode of the fifth transistor T5 is electrically connected to the first electrode of the driving transistor T1.

The sixth transistor T6 may be a p-type transistor and may include a polycrystalline semiconductor. The sixth transistor T6 transmits the driving current provided by the driving transistor T1 to the light emitting diode LED. A gate electrode of the sixth transistor T6 is electrically connected to the emission control line 155, a first electrode of the sixth transistor T6 is electrically connected to the second electrode of the driving transistor T1, and a second electrode of the sixth transistor T6 is electrically connected to the anode of the light emitting diode LED.

The seventh transistor T7 may be a p-type transistor and may include a polycrystalline semiconductor. The seventh transistor T7 initializes the anode of the light emitting diode LED. A gate electrode of the seventh transistor T7 is electrically connected to the bypass control line 154; a first electrode of the seventh transistor T7 is electrically connected to the anode of the light emitting diode LED; and a second electrode of the seventh transistor T7 is electrically connected to the second initialization voltage line 128. In case that the seventh transistor T7 is turned on by a negative voltage of the bypass signal GB, the second initialization voltage AINT is applied to the anode of the light emitting diode LED to initialize the light emitting diode LED.

In an embodiment, pixel PX includes seven transistors, a storage capacitor, and a boost capacitor, but the embodiments are not limited thereto. The number and types of transistors and capacitors, and their arrangements may be modified in various ways.

In an embodiment, the driving transistor T1 may include a polycrystalline semiconductor. The third transistor T3 and the fourth transistor T4 may include oxide semiconductors. The second transistor T2, the fifth transistor T5, the sixth transistor T6, and the seventh transistor T7 may include polycrystalline semiconductors. However, at least one of the second transistor T2, the fifth transistor T5, the sixth transistor T6, and the seventh transistor T7 may include an oxide semiconductor. The third transistor T3 and the fourth transistor T4 include different semiconductor materials from the driving transistor T1, so stability and reliability may be improved.

As described above, voltages having opposite polarities may be applied to the first scan line 151 and the second scan line 152. For example, a negative voltage is applied to the second scan line 152 in case that a positive voltage is applied to the first scan line 151, and a positive voltage is applied to the second scan line 152 in case that a negative voltage is applied to the first scan line 151. For example, the second scan signal GC applied to the second scan line 152 may be a signal inverted from the first scan signal GW applied to the first scan line 151, and thereby the gate voltage of the driving transistor T1 may be reduced after data is provided. In contrast, the first scan signal GW increases the gate voltage of the driving transistor T1. Therefore, a black voltage may be reduced in case that the black voltage is provided. In an embodiment, the boost capacitor Cbt is disposed between the first scan line 151, to which the first scan signal GW is applied, and the gate electrode of the driving transistor T1, thereby increasing the gate voltage of the driving transistor T1 and stably outputting the black voltage. As the boost capacitor Cbt has a greater capacitance, the gate voltage of the driving transistor T1 may be increased further. The gate voltage of the driving transistor T1 may be controlled by controlling the capacitance of the boost capacitor Cbt.

FIG. 2 to FIG. 10 are schematic plan views and cross-sectional views of a driving transistor T1, a third transistor T3, a first scan line 151, a boost capacitor Cbt and other components of pixels according to the embodiment.

Figure 2:
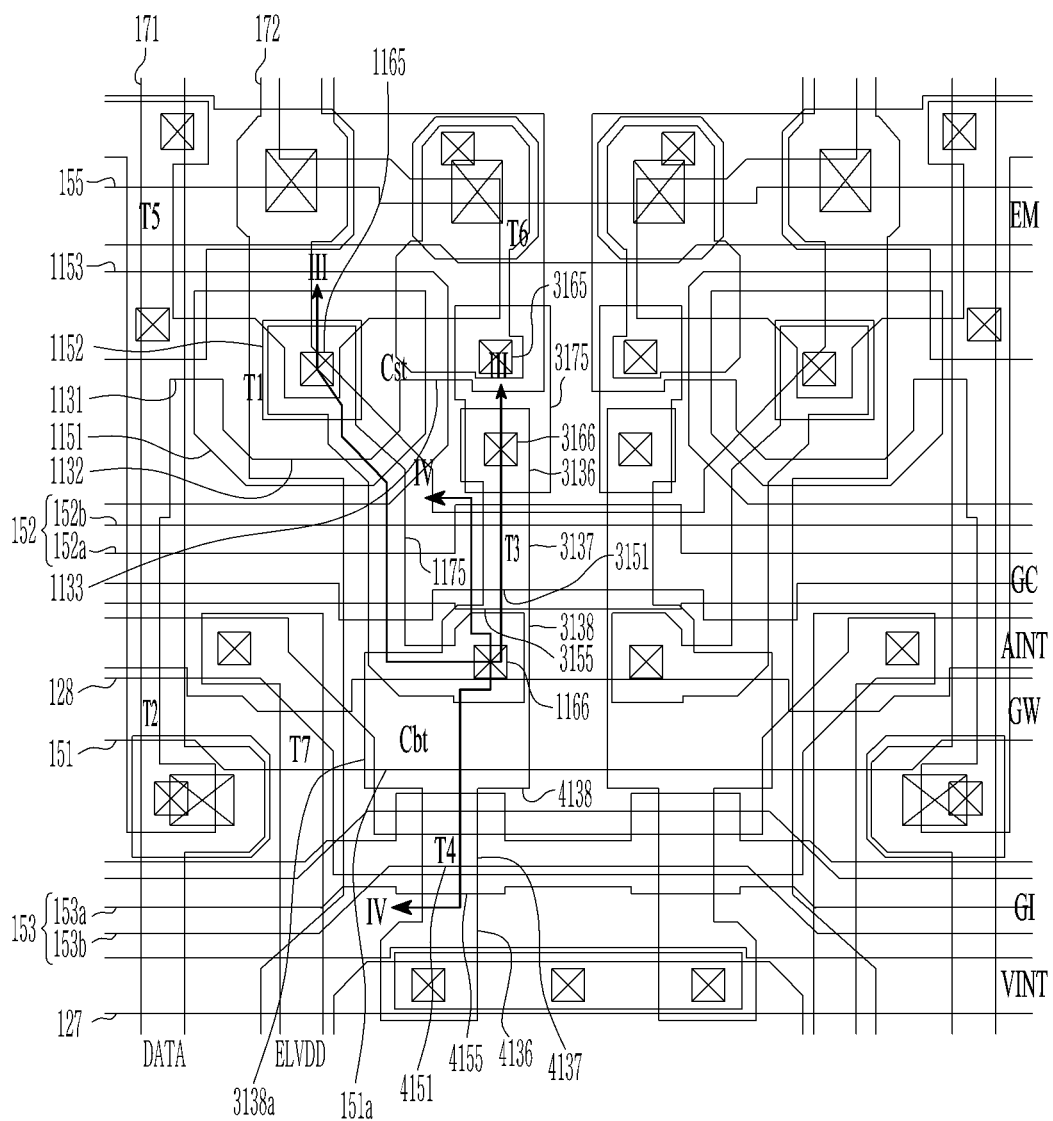
FIG. 2 shows a schematic top plan view of a display device according to an embodiment.
Figure 3:
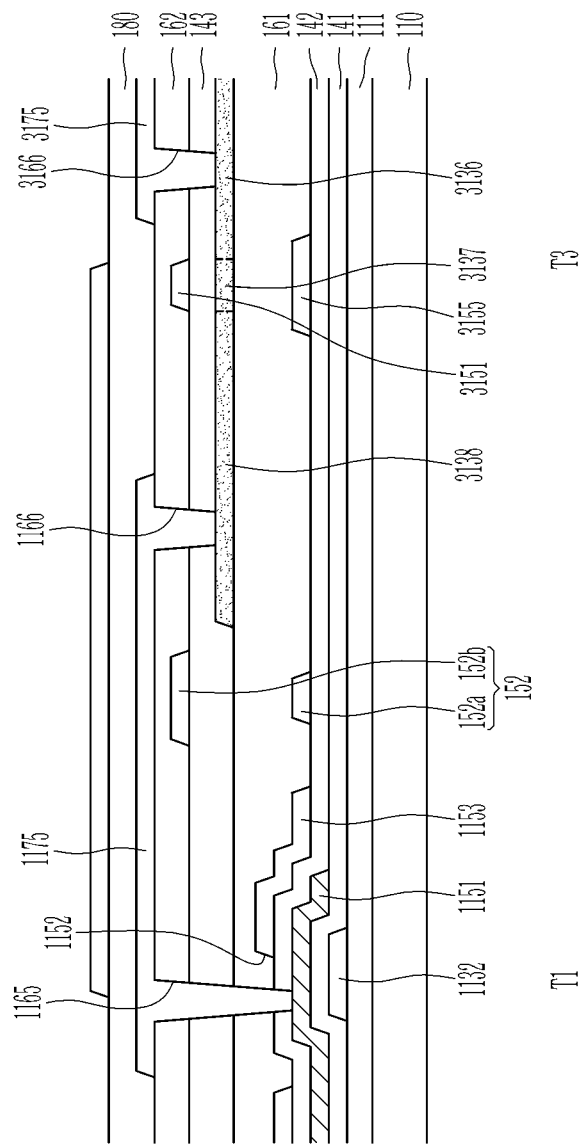
FIG. 3 shows a schematic cross-sectional view with respect to line III-III of FIG. 2.
Figure 4:
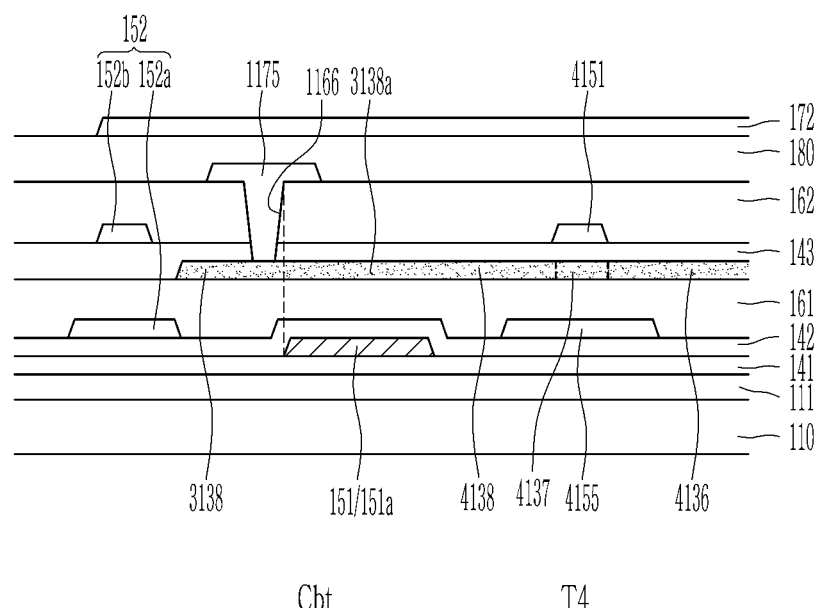
FIG. 4 shows a schematic cross-sectional view with respect to line IV-IV of FIG. 2.

FIG. 2 shows a schematic plan view of a display device according to an embodiment, FIG. 3 shows a schematic cross-sectional view with respect to line III-III and FIG. 4 shows a cross-sectional view with respect to line IV-IV of FIG. 2. FIG. 5 to FIG. 10 show sequential schematic plan views of manufacturing steps of a display device according to an embodiment. FIG. 2 and FIG. 5 to FIG. 10 show two adjacent pixels arranged symmetrically. However, the embodiments are not limited to this. For example, the two pixels may have a substantially same shape. For the sake of explanation, the pixel on a left side will be mainly described. Also, the seventh transistor T7 is electrically connected to the first scan line 151 at the previous stage (or of a previous pixel), which is therefore not illustrated, and a seventh transistor T7 at the next stage (or of a next pixel) is illustrated.

Figure 5:
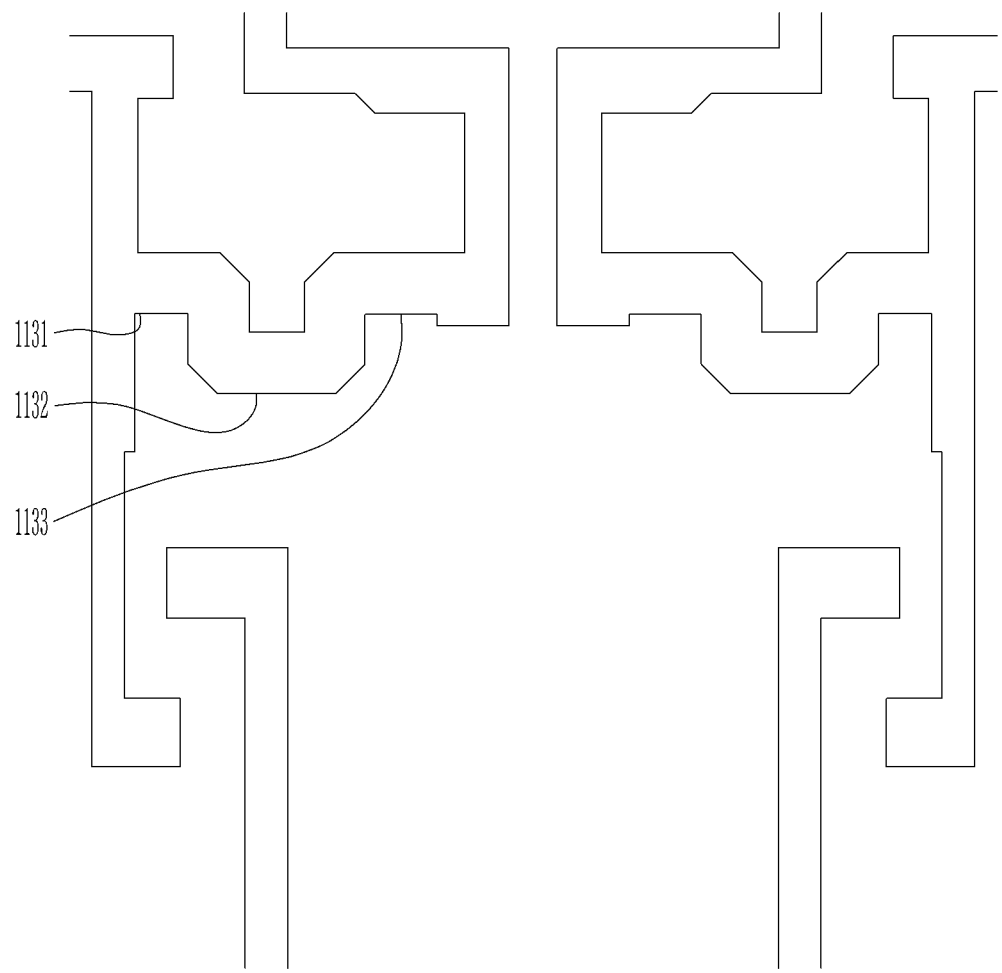
FIG. 5 to FIG. 10 show schematic sequential plan views illustrating manufacturing steps of a display device according to an embodiment.

As shown in FIG. 2 to FIG. 10, a polycrystalline semiconductor including a channel 1132, a first electrode 1131, and a second electrode 1133 of the driving transistor T1 may be disposed on the substrate 110. FIG. 5 illustrates a polycrystalline semiconductor which may further include channels, and first electrodes, and second electrodes of the second transistor T2, the fifth transistor T5, the sixth transistor T6, and the seventh transistor T7 in addition to the driving transistor T1.

The channel 1132 of the driving transistor T1 may have a bent shape in a plan view. However, the embodiments are not limited to such a shape, and the channel 1132 of the driving transistor T1 can be modified in various ways. For example, the channel 1132 of the driving transistor T1 may be bent in a different shape or may have a bar shape. The first electrode 1131 and the second electrode 1133 of the driving transistor T1 may be disposed on respective sides of the channel 1132 of the driving transistor T1. The first electrode 1131 of the driving transistor T1 may extend upward and downward in a plan view, a portion may extend downward to be electrically connected to the second electrode of the second transistor T2, and a portion may extend upward to be electrically connected to the second electrode of the fifth transistor T5. The second electrode 1133 of the driving transistor T1 may extend upward to be electrically connected to the first electrode of the sixth transistor T6 in a plan view.

A buffer layer 111 may be disposed between the substrate 110 and the polycrystalline semiconductor including the channel 1132, the first electrode 1131, and the second electrode 1133 of the driving transistor T1. The buffer layer 111 may have a single-layered or multi-layered structure. The buffer layer 111 may include an organic insulating material or an inorganic insulating material.

A first gate insulating layer 141 may be disposed on the polycrystalline semiconductor including the channel 1132, the first electrode 1131, and the second electrode 1133 of the driving transistor T1. The first gate insulating layer 141 may include a silicon nitride or a silicon oxide.

Figure 6:
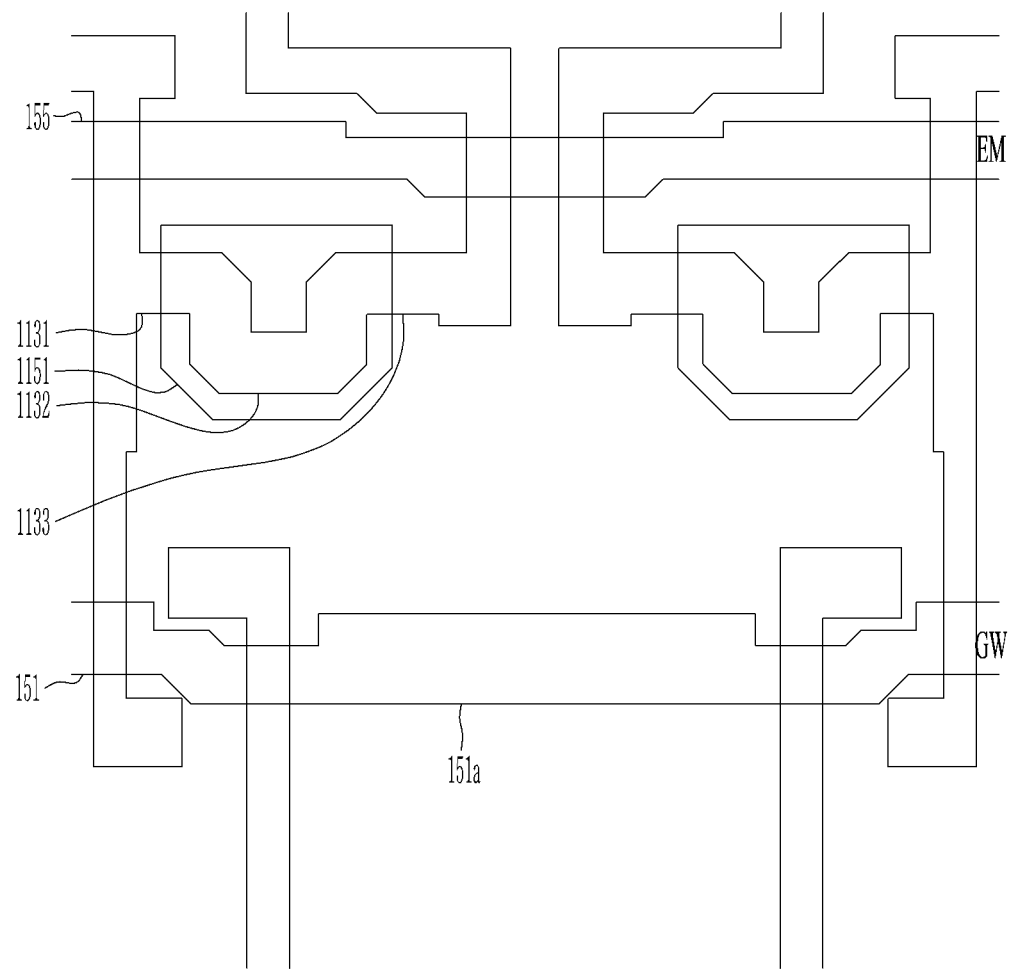

A first gate conductor including the gate electrode 1151 of the driving transistor T1 may be disposed on the first gate insulating layer 141. FIG. 6 illustrates a polycrystalline semiconductor and a first gate conductor. The first gate conductor may further include gate electrodes of the second transistor T2, the fifth transistor T5, the sixth transistor T6, and the seventh transistor T7 in addition to the driving transistor T1.

The gate electrode 1151 of the driving transistor T1 may overlap the channel 1132 of the driving transistor T1. The channel 1132 of the driving transistor T1 is overlapped or covered by the gate electrode 1151 of the driving transistor T1.

The first gate conductor may further include a first scan line 151 and an emission control line 155. The first scan line 151 and the emission control line 155 may substantially extend in a horizontal direction. The first scan line 151 may be electrically connected to the gate electrode of the second transistor T2 and the first boost electrode 151a. The first scan line 151 may be integral with the gate electrode of the second transistor T2. The first scan line 151 may be integral with the first boost electrode 151a. The first scan line 151 may be electrically connected to the gate electrode of the seventh transistor T7 positioned on the pixel at the next stage (or of the next pixel). For example, a bypass control line electrically connected to the seventh transistor T7 may be a first scan line 151 at the previous stage (or of the previous pixel). The gate electrode of the fifth transistor T5 and the gate electrode of the sixth transistor T6 may be electrically connected to the emission control line 155.

After the first gate conductor including the gate electrode 1151 of the driving transistor T1 is formed, a doping process may be performed. A portion of the polycrystalline semiconductor overlapped by the first gate conductor may not be doped, and a portion of the polycrystalline semiconductor not overlapped by the first gate conductor may be doped to have characteristics identical to a conductor. In this instance, the doping process may be performed with a p-type dopant, and the driving transistor T1 including a polycrystalline semiconductor, the second transistor T2, the fifth transistor T5, the sixth transistor T6, and the seventh transistor T7 may have p-type transistor characteristics.

A second gate insulating layer 142 may be disposed on the first gate conductor including the gate electrode 1151 of the driving transistor T1 and the first gate insulating layer 141. The second gate insulating layer 142 may include a silicon nitride or a silicon oxide.

Figure 7:
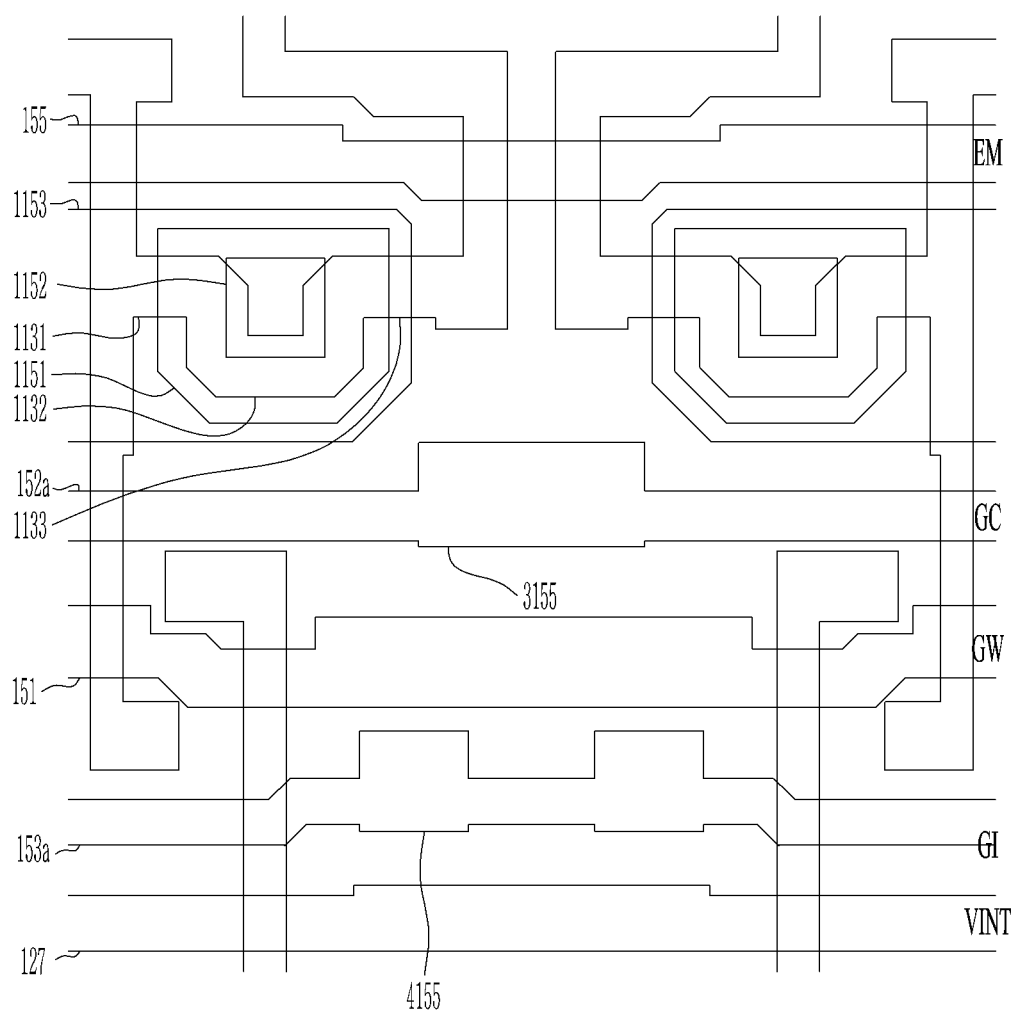

A second gate conductor including a first storage electrode 1153 of the storage capacitor Cst, a light blocking layer 3155 of the third transistor T3, and a light blocking layer 4155 of the fourth transistor T4 may be disposed on the second gate insulating layer 142. FIG. 7 illustrates a polycrystalline semiconductor, a first gate conductor, and a second gate conductor.

The first storage electrode 1153 overlaps the gate electrode 1151 of the driving transistor T1 to form a storage capacitor Cst (refer to, e.g., FIG. 3). An opening 1152 is formed in the first storage electrode 1153 of the storage capacitor Cst. The opening 1152 of the first storage electrode 1153 of the storage capacitor Cst may overlap the gate electrode 1151 of the driving transistor T1. The light blocking layer 3155 of the third transistor T3 may overlap a channel 3137 of the third transistor T3 and the gate electrode 3151. The light blocking layer 4155 of the fourth transistor T4 may overlap the channel 4137 of the fourth transistor T4 and the gate electrode 4151.

The second gate conductor may further include a lower second scan line 152a, a lower initialization control line 153a, and a first initialization voltage line 127. The lower second scan line 152a, the lower initialization control line 153a, and the first initialization voltage line 127 may substantially extend in the horizontal direction. The lower second scan line 152a may be electrically connected to the light blocking layer 3155 of the third transistor T3. The lower second scan line 152a may be integral with the light blocking layer 3155 of the third transistor T3. The lower initialization control line 153a may be electrically connected to the light blocking layer 4155 of the fourth transistor T4. The lower initialization control line 153a may be integral with the light blocking layer 4155 of the fourth transistor T4.

A first interlayer insulating layer 161 may be disposed on the second gate conductor including the first storage electrode 1153 of the storage capacitor Cst, the light blocking layer 3155 of the third transistor T3, and the light blocking layer 4155 of the fourth transistor T4. The first interlayer insulating layer 161 may include a silicon nitride or a silicon oxide.

Figure 8:
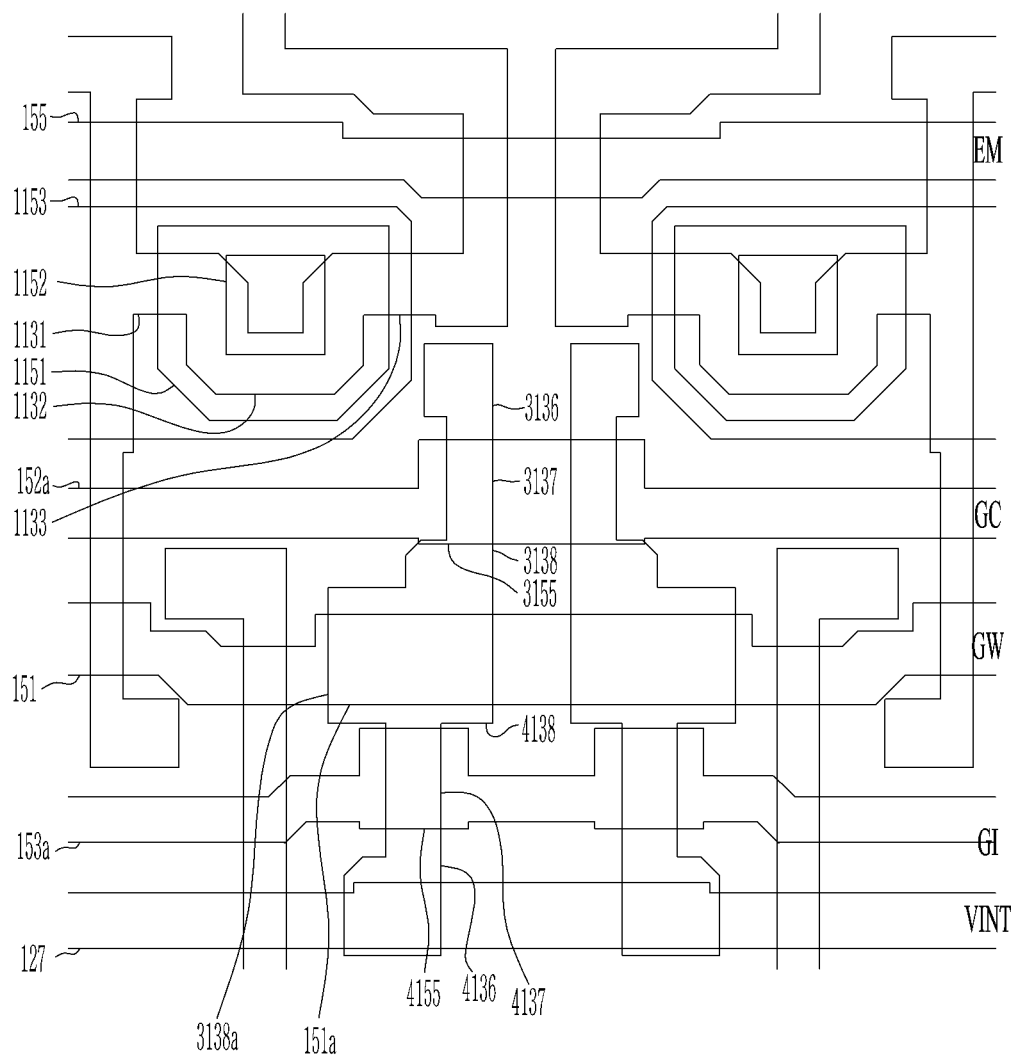

An oxide semiconductor including the channel 3137, the first electrode 3136, and the second electrode 3138 of the third transistor T3, and the channel 4137, the first electrode 4136, and the second electrode 4138 of the fourth transistor T4, may be disposed on the first interlayer insulating layer 161. FIG. 8 illustrates a polycrystalline semiconductor, a first gate conductor, a second gate conductor, and an oxide semiconductor.

The oxide semiconductor may include at least one of unary metal oxides such as an indium (In) based oxide, a tin (Sn) based oxide, or a zinc (Zn) based oxide; binary metal oxides such as an In—Zn based oxide, a Sn—Zn based oxide, an Al—Zn based oxide, a Zn—Mg based oxide, a Sn—Mg based oxide, an In—Mg based oxide, or an In—Ga based oxide; ternary metal oxides such as an In—Ga—Zn based oxide, an In—Al—Zn based oxide, an In—Sn—Zn based oxide, a Sn—Ga—Zn based oxide, an Al—Ga—Zn based oxide, a Sn—Al—Zn based oxide, an In—Hf—Zn based oxide, an In—La—Zn based oxide, an In—Ce—Zn based oxide, an In—Pr—Zn based oxide, an In—Nd—Zn based oxide, an In—Sm—Zn based oxide, an In—Eu—Zn based oxide, an In—Gd—Zn based oxide, an In—Tb—Zn based oxide, an In—Dy—Zn based oxide, an In—Ho—Zn based oxide, an In—Er—Zn based oxide, an In—Tm—Zn based oxide, an In—Yb—Zn based oxide, or an In—Lu—Zn based oxide; and quaternary metal oxides such as an In—Sn—Ga—Zn based oxide, an In—Hf—Ga—Zn based oxide, an In—Al—Ga—Zn based oxide, an In—Sn—Al—Zn based oxide, an In—Sn—Hf—Zn based oxide, or an In—Hf—Al—Zn based oxide. For example, the oxide semiconductor may include an indium-gallium-zinc oxide (IGZO) from among the In—Ga—Zn-based oxide.

The channel 3137, the first electrode 3136, and the second electrode 3138 of the third transistor T3 and the channel 4137, the first electrode 4136, and the second electrode 4138 of the fourth transistor T4 may be electrically connected to each other and may be integral with each other. The first electrode 3136 and the second electrode 3138 of the third transistor T3 may be positioned on respective sides of the channel 3137 of the third transistor T3. The first electrode 4136 and the second electrode 4138 of the fourth transistor T4 may be disposed on respective sides of the channel 4137 of the fourth transistor T4. The second electrode 3138 of the third transistor T3 may be electrically connected to the second electrode 4138 of the fourth transistor T4. The channel 3137 of the third transistor T3 may overlap the light blocking layer 3155. The channel 4137 of the fourth transistor T4 may overlap the light blocking layer 4155.

The oxide semiconductor may further include a second boost electrode 3138a. The second boost electrode 3138a may be electrically connected to the second electrode 3138 of the third transistor T3. The second boost electrode 3138a may be integral with the second electrode 3138 of the third transistor T3. The second boost electrode 3138a may be electrically connected to the second electrode 4138 of the fourth transistor T4. The second boost electrode 3138a may be integral with the second electrode 4138 of the fourth transistor T4. The second boost electrode 3138a may overlap the first boost electrode 151a. The capacitance of the boost capacitor Cbt may be determined by an overlapping area of the first boost electrode 151a and the second boost electrode 3138a and the thicknesses of the second gate insulating layer 142 disposed between the first boost electrode 151a and the second boost electrode 3138a and the first interlayer insulating layer 161.

A third gate insulating layer 143 may be disposed on the oxide semiconductor including the channel 3137, the first electrode 3136, and the second electrode 3138 of the third transistor T3, and the channel 4137, the first electrode 4136, and the second electrode 4138 of the fourth transistor T4. The third gate insulating layer 143 may be disposed on the oxide semiconductor and an entire side of the first interlayer insulating layer 161. Therefore, the third gate insulating layer 143 may overlap upper sides and lateral sides of the channel 3137, the first electrode 3136, and the second electrode 3138 of the third transistor T3 and the channel 4137, the first electrode 4136, and the second electrode 4138 of the fourth transistor T4. However, the embodiments are not limited thereto, and the third gate insulating layer 143 may not be disposed on the oxide semiconductor and the entire side of the first interlayer insulating layer 161. For example, the third gate insulating layer 143 may overlap the channel 3137 of the third transistor T3 but may not overlap the first electrode 3136 and the second electrode 3138. The third gate insulating layer 143 may overlap the channel 4137 of the fourth transistor T4 but may not overlap the first electrode 4136 and the second electrode 4138.

Figure 9:
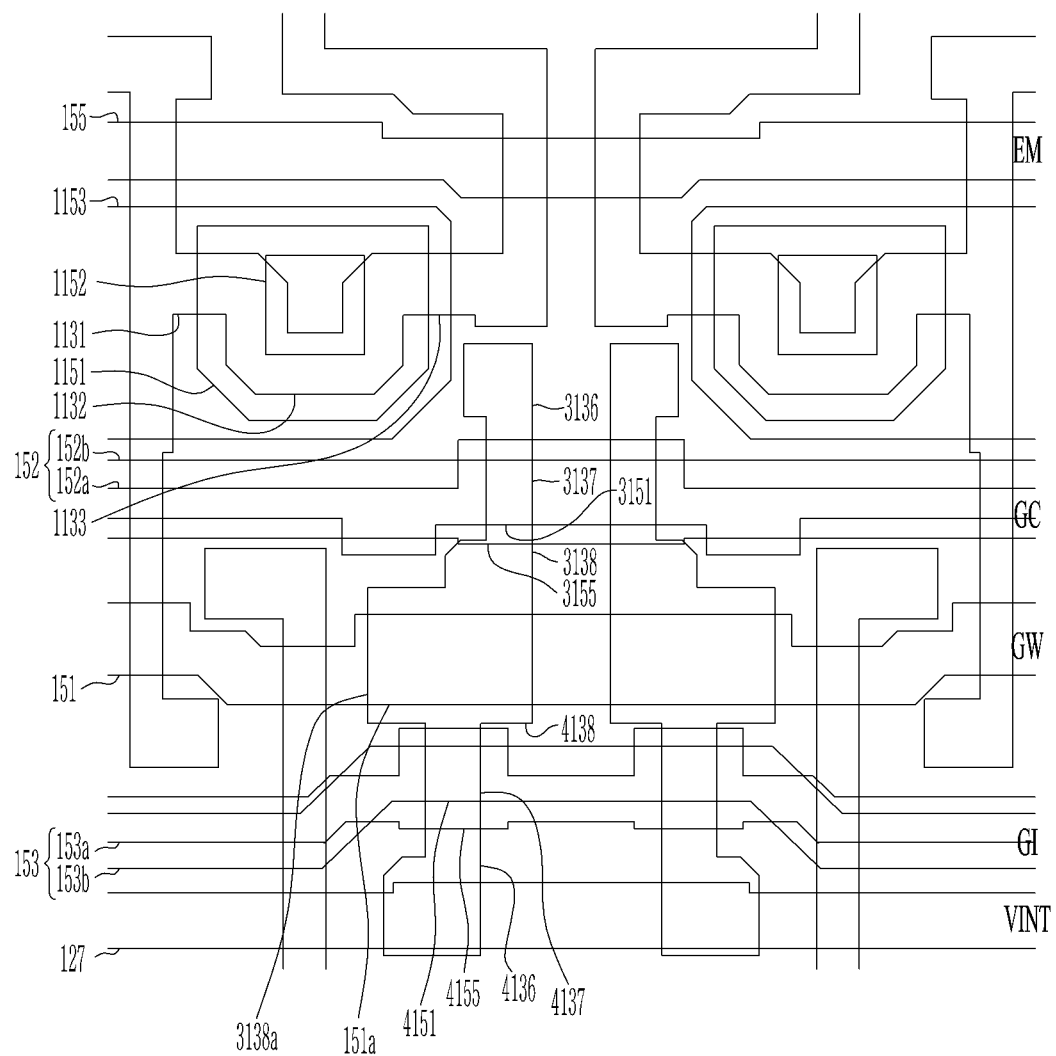

A third gate conductor including the gate electrode 3151 of the third transistor T3 and the gate electrode 4151 of the fourth transistor T4 may be disposed on the third gate insulating layer 143. FIG. 9 illustrates a polycrystalline semiconductor, a first gate conductor, a second gate conductor, an oxide semiconductor, and a third gate conductor.

The gate electrode 3151 of the third transistor T3 may overlap the channel 3137 of the third transistor T3. The gate electrode 3151 of the third transistor T3 may overlap the light blocking layer 3155 of the third transistor T3.

The gate electrode 4151 of the fourth transistor T4 may overlap the channel 4137 of the fourth transistor T4. The gate electrode 4151 of the fourth transistor T4 may overlap the light blocking layer 4155 of the fourth transistor T4.

The third gate conductor may further include an upper second scan line 152b and an upper initialization control line 153b. The upper second scan line 152b and the upper initialization control line 153b may substantially extend in the horizontal direction. The upper second scan line 152b forms the second scan line 152 together with a lower second scan line 152a. The upper second scan line 152b may be electrically connected to the gate electrode 3151 of the third transistor T3. The upper second scan line 152b may be integral with the gate electrode 3151 of the third transistor T3. The upper initialization control line 153b forms the initialization control line 153 together with the lower initialization control line 153a. The upper initialization control line 153b may be electrically connected to the gate electrode 4151 of the fourth transistor T4. The upper initialization control line 153b may be integral with the gate electrode 4151 of the fourth transistor T4.

After the third gate conductor including the gate electrode 3151 of the third transistor T3 and the gate electrode 4151 of the fourth transistor T4 is formed, a doping process may be performed. A portion of the oxide semiconductor overlapped by the third gate conductor may not be doped, and a portion of the oxide semiconductor not overlapped by the third gate conductor may be doped to have same characteristics as a conductor. The channel 3137 of the third transistor T3 may be disposed below the gate electrode 3151 to overlap the gate electrode 3151. The first electrode 3136 and the second electrode 3138 of the third transistor T3 may not overlap the gate electrode 3151. The channel 4137 of the fourth transistor T4 may be disposed below the gate electrode 4151 to overlap the gate electrode 4151. The first electrode 4136 and the second electrode 4138 of the fourth transistor T4 may not overlap the gate electrode 4151. The second boost electrode 3138a may not overlap the third gate conductor. The doping process of the oxide semiconductor may be performed with an n-type dopant, and thus the third transistor T3 and the fourth transistor T4 including oxide semiconductors may have n-type transistor characteristics.

A second interlayer insulating layer 162 may be disposed on the third gate conductor including the gate electrode 3151 of the third transistor T3 and the gate electrode 4151 of the fourth transistor T4. The second interlayer insulating layer 162 may include a first opening 1165, a second opening 1166, a third opening 3165, and a fourth opening 3166.

The first opening 1165 may overlap at least part of the gate electrode 1151 of the driving transistor T1. The first opening 1165 may be further formed in the third gate insulating layer 143, the first interlayer insulating layer 161, and the second gate insulating layer 142. The first opening 1165 may overlap the opening 1152 of the first storage electrode 1153. The first opening 1165 may be disposed inside the opening 1152 of the first storage electrode 1153.

The second opening 1166 may overlap at least part of the second electrode 3138 of the third transistor T3. The second opening 1166 may be further formed in the third gate insulating layer 143. The second opening 1166 may be disposed between the first scan line 151 and the second scan line 152 in a plan view. The second opening 1166 may not overlap the first scan line 151. A side edge of the second opening 1166 may correspond to a side edge of the first scan line 151. For example, the lower-side edge of the second opening 1166 may correspond to an upper-side edge of the first scan line 151. However, the embodiments are not limited thereto, and the side edge of the second opening 1166 may not correspond to the side edge of the first scan line 151. For example, the lower-side edge of the second opening 1166 may be spaced apart from the upper-side edge of the first scan line 151, and the lower-side edge of the second opening 1166 may be disposed above the upper-side edge of the first scan line 151. The second opening 1166 may not overlap the second scan line 152. In this instance, the second opening 1166 may not overlap the upper second scan line 152b. The second opening 1166 may not overlap the lower second scan line 152a. The second opening 1166 may not overlap the boost capacitor Cbt. For example, the second opening 1166 may not overlap the overlapping portion of the first boost electrode 151a and the second boost electrode 3138a.

The third opening 3165 may overlap at least part of the second electrode 1133 of the driving transistor T1. The third opening 3165 may be further formed in the third gate insulating layer 143, the first interlayer insulating layer 161, the second gate insulating layer 142, and the first gate insulating layer 141. The fourth opening 3166 may overlap at least part of the first electrode 3136 of the third transistor T3. The fourth opening 3166 may be further formed in the third gate insulating layer 143.

Figure 10:
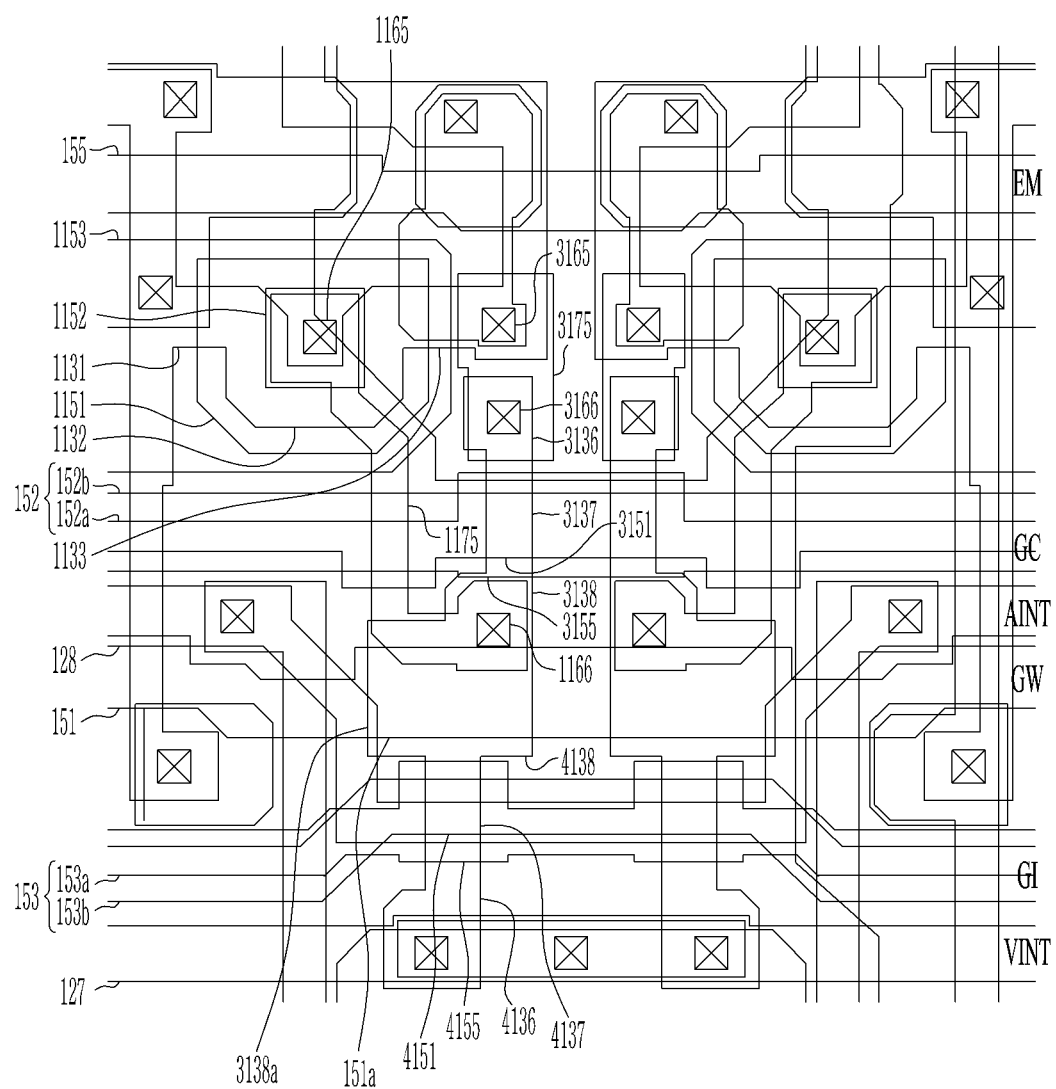

A first data conductor including a first connection electrode 1175 and a second connection electrode 3175 may be disposed on the second interlayer insulating layer 162. FIG. 10 illustrates a polycrystalline semiconductor, a first gate conductor, a second gate conductor, an oxide semiconductor, a third gate conductor, and a first data conductor.

The first connection electrode 1175 may overlap the gate electrode 1151 of the driving transistor T1. The first connection electrode 1175 may be electrically connected to the gate electrode 1151 of the driving transistor T1 through the first opening 1165 and the opening 1152 of the first storage electrode 1153. The first connection electrode 1175 may overlap the second electrode 3138 of the third transistor T3. The first connection electrode 1175 may be electrically connected to the second electrode 3138 of the third transistor T3 through the second opening 1166. Therefore, the gate electrode 1151 of the driving transistor T1 may be electrically connected to the second electrode 3138 of the third transistor T3 by the first connection electrode 1175. In this instance, the gate electrode 1151 of the driving transistor T1 may be electrically connected to the second boost electrode 3138a and the second electrode 4138 of the fourth transistor T4 by the first connection electrode 1175.

The first connection electrode 1175 may electrically contact the second electrode 3138 of the third transistor T3. A contact portion on which the first connection electrode 1175 electrically contacts the second electrode 3138 of the third transistor T3 may be disposed in the second opening 1166. The second opening 1166 does not overlap the first scan line 151, so the contact portion of the first connection electrode 1175 and the second electrode 3138 of the third transistor T3 may not overlap the first scan line 151. The first connection electrode 1175 may overlap the first scan line 151. Part of the first connection electrode 1175 may overlap the first scan line 151. However, the embodiments are not limited thereto. For example, the first connection electrode 1175 may not overlap the first scan line 151. The second opening 1166 does not overlap the second scan line 152, so at least part of the contact portion of the first connection electrode 1175 and the second electrode 3138 of the third transistor T3 may not overlap the second scan line 152. The contact portion of the first connection electrode 1175 and the second electrode 3138 of the third transistor T3 may not overlap the upper second scan line 152b. The contact portion of the first connection electrode 1175 and the second electrode 3138 of the third transistor T3 may not overlap the lower second scan line 152a. The first connection electrode 1175 may not overlap the second scan line 152a. The second opening 1166 does not overlap the boost capacitor Cbt, so the contact portion of the first connection electrode 1175 and the second electrode 3138 of the third transistor T3 may not overlap the boost capacitor Cbt.

The second connection electrode 3175 may overlap the second electrode 1133 of the driving transistor T1. The second connection electrode 3175 may be electrically connected to the second electrode 1133 of the driving transistor T1 through the third opening 3165. The second connection electrode 3175 may overlap the first electrode 3136 of the third transistor T3. The second connection electrode 3175 may be electrically connected to the first electrode 3136 of the third transistor T3 through the fourth opening 3166. Therefore, the second connection electrode 3175 may electrically connect the second electrode 1133 of the driving transistor T1 and the first electrode 3136 of the third transistor T3 to each other.

The first data conductor may further include a second initialization voltage line 128. The second initialization voltage line 128 may substantially extend in the horizontal direction.

A third interlayer insulating layer 180 may be disposed on the first data conductor including the first connection electrode 1175 and the second connection electrode 3175.

A data line 171 and a driving voltage line 172 may be disposed on the third interlayer insulating layer 180. The data line 171 and the driving voltage line 172 may substantially extend in the vertical direction. The data line 171 may be electrically connected to the second transistor T2. The driving voltage line 172 may be electrically connected to the fifth transistor T5. The driving voltage line 172 may be electrically connected to the first storage electrode 1153.

Although not shown, a passivation layer may be disposed on the data line 171 and the driving voltage line 172, and an anode may be disposed on the passivation layer. The anode may be electrically connected to the sixth transistor T6 and may receive an output current of the driving transistor T1. A partition wall may be disposed on the anode. An opening is formed in the partition wall, and the opening in the partition wall may overlap the anode. A light-emitting device layer may be disposed in the partition wall. A cathode may be disposed on the light-emitting device layer and in the partition wall. The anode, the light-emitting device layer, and the cathode may form a light emitting diode LED.

Regarding the display device according to an embodiment, the driving transistor T1 may include a polycrystalline semiconductor, and the third transistor T3 and the fourth transistor T4 may include oxide semiconductors. As described above, the third transistor T3 and the fourth transistor T4 include different semiconductor materials from the driving transistor T1, so the stability and reliability may be improved.

A compensation voltage transfer route CTR to a gate electrode of a driving transistor through a third transistor will now be described with reference to FIG. 11 together with FIG. 1 to FIG. 10.

Figure 11:
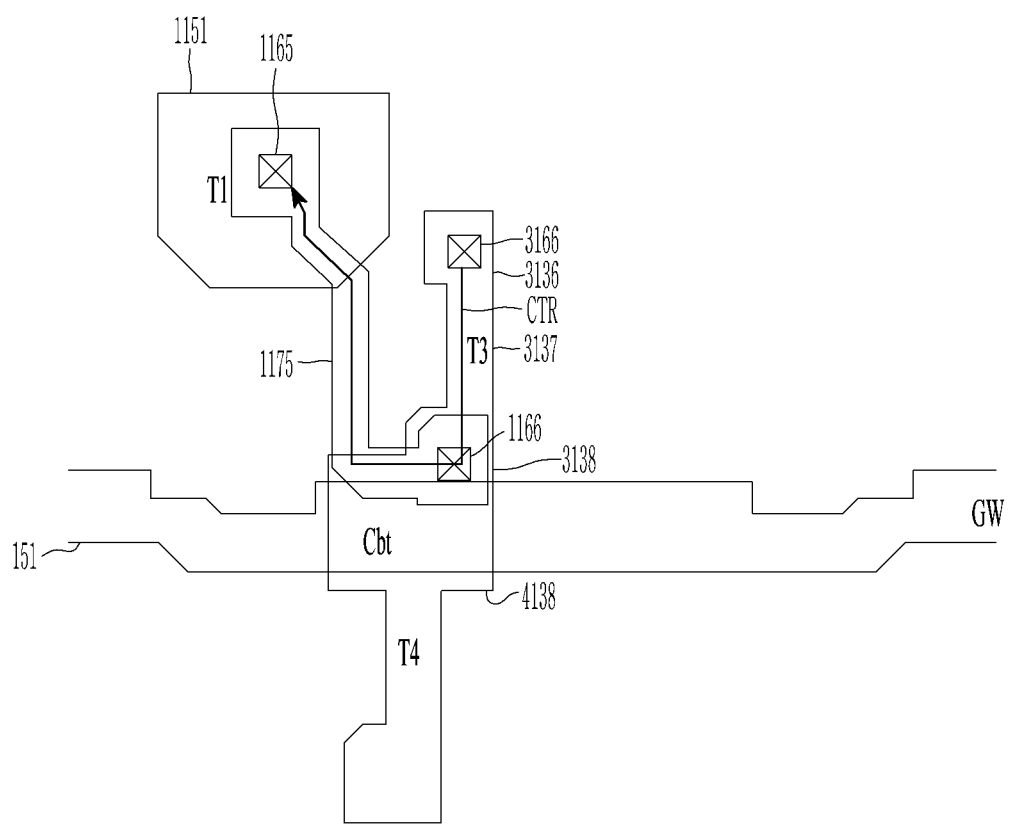
FIG. 11 shows a schematic plan view of part of a display device according to an embodiment.

FIG. 11 shows a schematic plan view of part of a display device in an embodiment. FIG. 11 shows some layers of a first scan line, a driving transistor, a third transistor, and a fourth transistor.

As shown in FIG. 11, the data voltage DATA applied through the second transistor T2 is transmitted to the third transistor T3 through the driving transistor T1. The third transistor T3 electrically connects the second electrode 1133 of the driving transistor T1 and the gate electrode 1151 of the driving transistor T1 to each other. The first electrode 3136 of the third transistor T3 electrically contacts the second electrode 1133 of the driving transistor T1, and the second electrode 3138 of the third transistor T3 electrically contacts the gate electrode 1151 of the driving transistor T1. The second electrode 3138 of the third transistor T3 is electrically connected to the gate electrode 1151 of the driving transistor T1 through the first connection electrode 1175. The compensation voltage changed from the data voltage DATA by the third transistor T3 is transmitted to the gate electrode 1151 of the driving transistor T1 through the first connection electrode 1175. The first electrode 3136, the channel 3137, and the second electrode 3138 of the third transistor T3 included in a compensation voltage transfer route CTR are made of oxide semiconductors. The second electrode 3138 of the third transistor T3 may overlap the first scan line 151. The second electrode 3138 of the third transistor T3 is integral with the second boost electrode 3138a, the first scan line 151 is integral with the first boost electrode 151a, and the first boost electrode 151a overlaps the second boost electrode 3138a to form a boost capacitor Cbt.

As described above, voltages with opposite polarities are applied at a same time to the first scan line 151 and the second scan line 152. The first scan line 151 is electrically connected to the gate electrode of the second transistor T2, and the second scan line 152 is electrically connected to the gate electrode of the third transistor T3. The second transistor T2 is a p-type transistor, and the third transistor T3 is an n-type transistor. Therefore, in case that a negative voltage is applied to the first scan line 151 and a positive voltage is applied to the second scan line 152, the second transistor T2 and the third transistor T3 are turned on.

A portion where the second electrode 3138 of the third transistor T3 including an oxide semiconductor overlaps the first scan line 151 may be influenced by the negative voltage applied to the first scan line 151. For example, the negative voltage may attract positive charges to the bottom surface of the second electrode 3138 of the third transistor T3 that is near the first scan line 151. Also, negative charges may gather on an upper side of the second electrode 3138 of the third transistor T3 that is further away from the first scan line 151. This may increase the resistance at a portion where the second electrode 3138 of the third transistor T3 overlaps the first scan line 151, and thus the voltage may not be smoothly transmitted.

In an embodiment, the contact portion of the first connection electrode 1175 and the second electrode 3138 of the third transistor T3 may not overlap the first scan line 151. Thus, the compensation voltage transfer route CTR may avoid the portion where the second electrode 3138 of the third transistor T3 overlaps the first scan line 151. Therefore, resistance is prevented from increasing in the compensation voltage transfer route CTR, the compensation voltage may be smoothly transmitted, and horizontal line defects may be reduced.

It has been described in the above that the contact portion of the first connection electrode 1175 and the second electrode 3138 of the third transistor T3 does not overlap the first scan line 151. However, the embodiments are not limited thereto. For example, the contact portion of the first connection electrode 1175 and the second electrode 3138 of the third transistor T3 does not overlap the first scan line 151 and other wires for applying a negative voltage, so equivalent or similar effects may be obtained.

A display device according to a comparative example will now be described with reference to FIG. 12 and FIG. 13.

Figure 12:
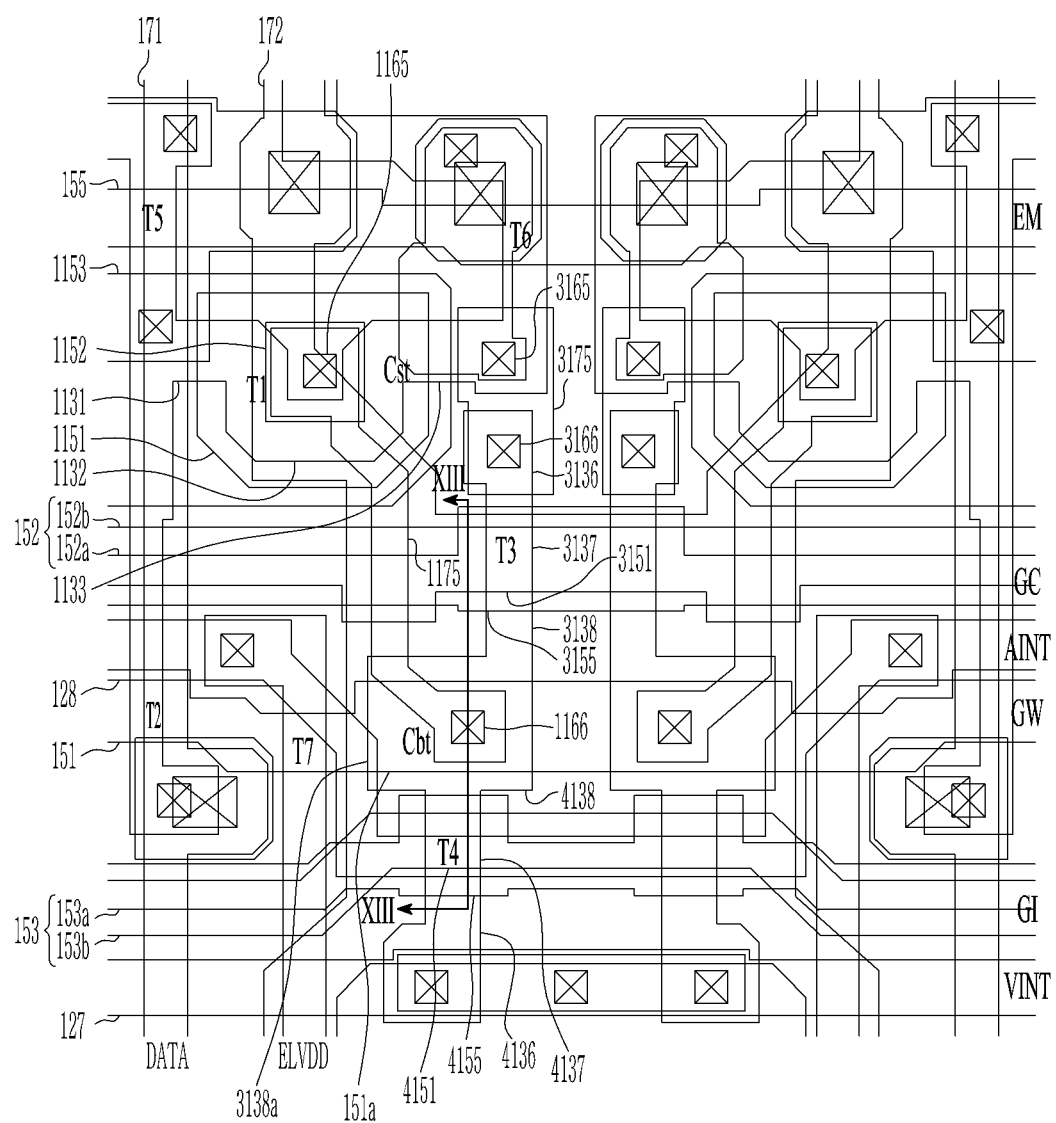
FIG. 12 shows a schematic plan view of a display device according to a comparative example.
Figure 13:
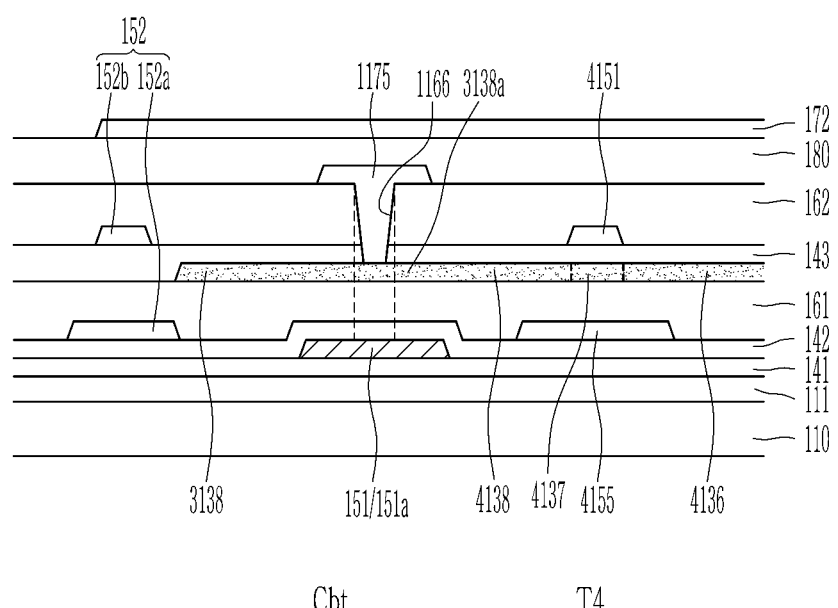
FIG. 13 shows a schematic cross-sectional view with respect to line XIII-XIII of FIG. 12.

FIG. 12 shows a schematic plan view of a display device according to a comparative example, and FIG. 13 shows a schematic cross-sectional view with respect to line XIII-XIII of FIG. 12.

As shown in FIG. 12 and FIG. 13, the display device according to a comparative example mostly has a same configuration as the above-described display device according to an exemplary embodiment except that the second opening 1166 overlaps the first scan line 151.

Regarding the display device according to a comparative example, the entire second opening 1166 overlaps the first scan line 151. Therefore, the contact portion of the first connection electrode 1175 and the second electrode 3138 of the third transistor T3 overlaps the first scan line 151. Therefore, the contact portion of the first connection electrode 1175 and the second electrode 3138 of the third transistor T3 overlaps the boost capacitor Cbt.

Regarding the display device according to a comparative example, the compensation voltage transfer route passes through a portion where the second electrode 3138 of the third transistor T3 overlaps the first scan line 151. Hence, the resistance of the compensation voltage transfer route increases, and the compensation voltage is not smoothly transmitted, which may be seen as horizontal stains.

Regarding the display device according to an exemplary embodiment, the compensation voltage transfer route avoids the portion where the second electrode 3138 of the third transistor T3 overlaps the first scan line 151, so the compensation voltage may be smoothly transmitted compared to the display device according to a comparative example.

An embodiment will be described with reference to FIG. 14 to FIG. 16.

Figure 14:
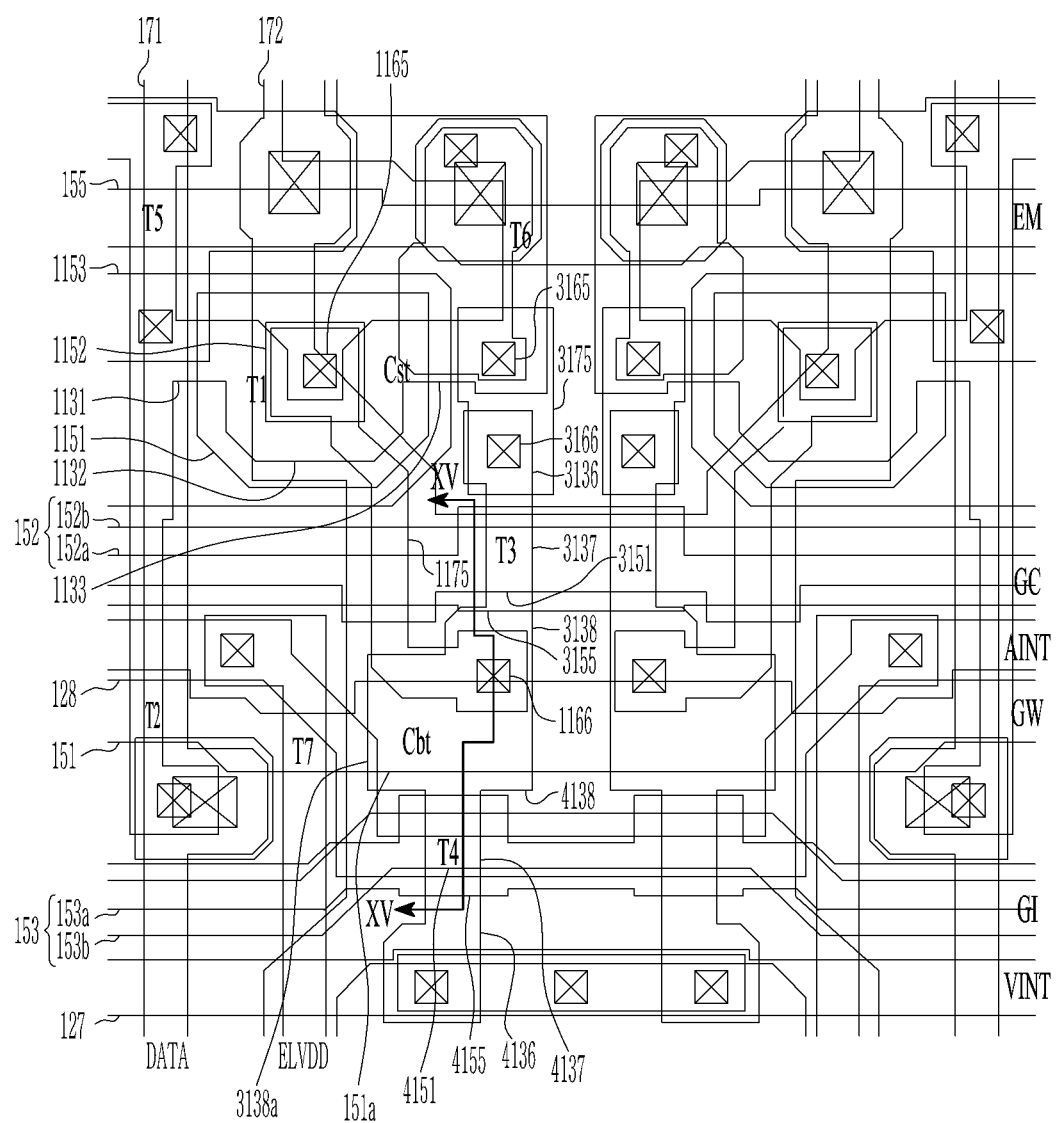
FIG. 14 shows a schematic plan view of a display device according to an embodiment.
Figure 15:
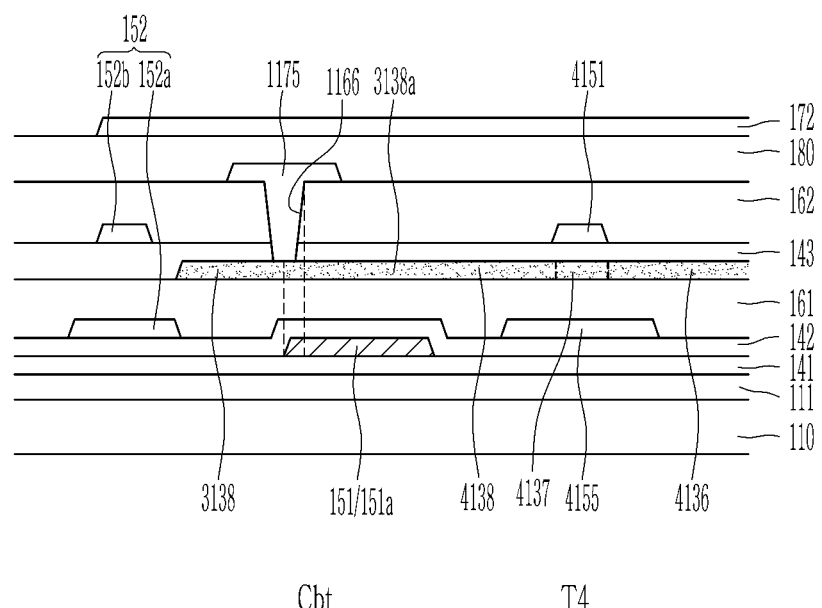
FIG. 15 shows a schematic cross-sectional view with respect to line XV-XV of FIG. 14.
Figure 16:
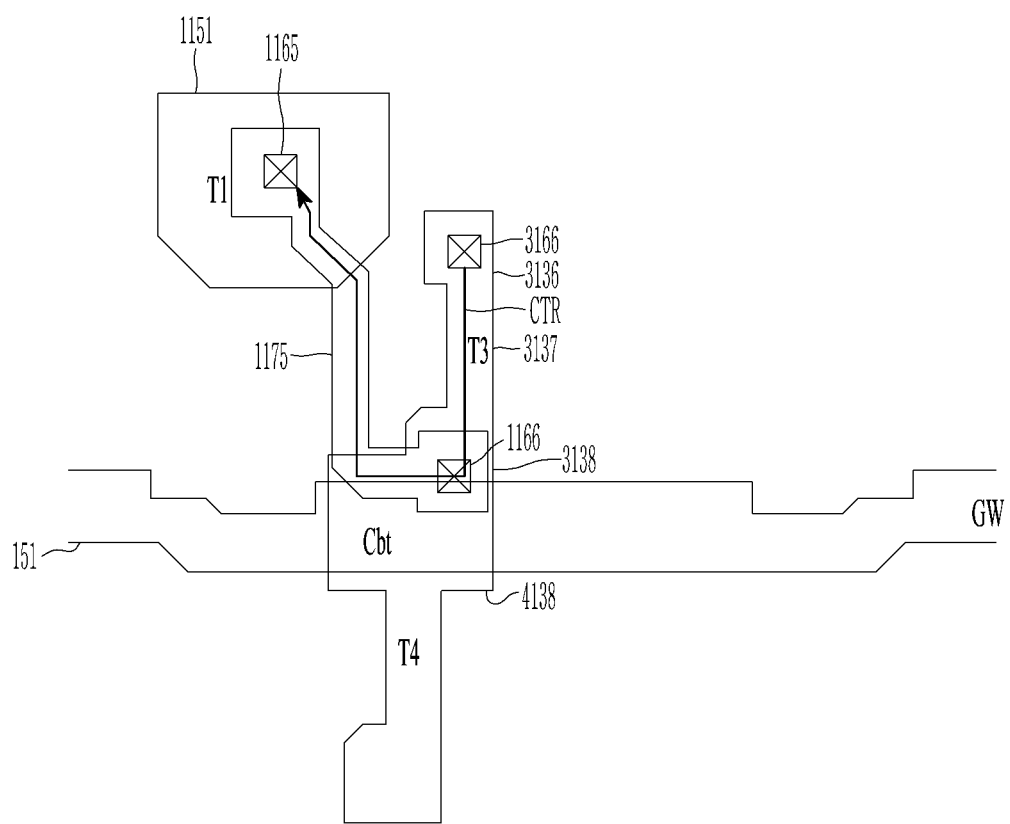
FIG. 16 shows a schematic plan view of part of a display device according to an embodiment.

The embodiments described in FIG. 14 to FIG. 16 are similar to the embodiments described with reference to FIG. 1 to FIG. 11. In an embodiment, the contact portion of the first connection electrode and the second electrode of the third transistor partly overlaps the first scan line, and this feature is at least distinguishable from the above-described embodiment(s) and will now be described.

FIG. 14 shows a schematic plan view of a display device according to an embodiment, FIG. 15 shows a schematic cross-sectional view with respect to line XV-XV of FIG. 14, and FIG. 16 shows a schematic plan view of part of a display device according to an embodiment.

As shown in FIG. 14 to FIG. 16, the display device according to an embodiment includes multiple wires 127, 128, 151, 152, 153, 154, 155, 171, and 172, multiple T1, T2, T3, T4, T5, T6, and T7 electrically connected to the wires, a storage capacitor Cst, a boost capacitor Cbt, and a light emitting diode LED (not shown).

The third transistor T3 includes a first electrode 3136 electrically connected to the first electrode 1131 of the driving transistor T1, a second electrode 3138 electrically connected to the first connection electrode 1175, a channel 3137 disposed between the first electrode 3136 and the second electrode 3138, and a gate electrode 3151 overlapping the channel 3137.

A second interlayer insulating layer 162 may be disposed on the gate electrode 3151 of the third transistor T3, and the second interlayer insulating layer 162 may include a first opening 1165, a second opening 1166, a third opening 3165, and a fourth opening 3166.

The second opening 1166 may overlap at least part of the second electrode 3138 of the third transistor T3. The second opening 1166 may be further formed in the third gate insulating layer 143. The second opening 1166 may be disposed between the first scan line 151 and the second scan line 152 in a plan view. At least part of the second opening 1166 may not overlap the first scan line 151. Part of the second opening 1166 may overlap the first scan line 151, and the remaining part of the second opening 1166 may not overlap the first scan line 151. For example, a half of the second opening 1166 may overlap the first scan line 151, and the other half of the second opening 1166 may not overlap the first scan line 151. The second opening 1166 may not overlap the second scan line 152. In this instance, the second opening 1166 may not overlap the upper second scan line 152b. The second opening 1166 may not overlap the lower second scan line 152a. At least part of the second opening 1166 may not overlap the boost capacitor Cbt. For example, at least part of the second opening 1166 may not overlap the overlapping portion of the first boost electrode 151a and the second boost electrode 3138a. Part of the second opening 1166 may overlap the boost capacitor Cbt, and the remaining part of the second opening 1166 may not overlap the boost capacitor Cbt.

The first connection electrode 1175 may be electrically connected the second electrode 3138 of the third transistor T3 through the second opening 1166.

The first connection electrode 1175 may electrically contact the second electrode 3138 of the third transistor T3. The contact portion where the first connection electrode 1175 electrically contacts the second electrode 3138 of the third transistor T3 may be disposed in the second opening 1166. At least part of the second opening 1166 does not overlap the first scan line 151, so at least part of the contact portion of the first connection electrode 1175 and the second electrode 3138 of the third transistor T3 may not overlap the first scan line 151. Part of the contact portion of the first connection electrode 1175 and the second electrode 3138 of the third transistor T3 may overlap the first scan line 151, and the remaining part of the contact portion of the first connection electrode 1175 and the second electrode 3138 of the third transistor T3 may not overlap the first scan line 151. The first connection electrode 1175 may overlap the first scan line 151. Part of the first connection electrode 1175 may overlap the first scan line 151. The second opening 1166 does not overlap the second scan line 152, so at least part of the contact portion of the first connection electrode 1175 and the second electrode 3138 of the third transistor T3 may not overlap the second scan line 152. The contact portion of the first connection electrode 1175 and the second electrode 3138 of the third transistor T3 may not overlap the upper second scan line 152b. The contact portion of the first connection electrode 1175 and the second electrode 3138 of the third transistor T3 may not overlap the lower second scan line 152a. The first connection electrode 1175 may not overlap the second scan line 152a. At least part of the second opening 1166 does not overlap the boost capacitor Cbt, so at least part of the contact portion of the first connection electrode 1175 and the second electrode 3138 of the third transistor T3 may not overlap the boost capacitor Cbt. Part of the contact portion of the first connection electrode 1175 and the second electrode 3138 of the third transistor T3 may overlap the boost capacitor Cbt, and the remaining part of the contact portion of the first connection electrode 1175 and the second electrode 3138 of the third transistor T3 may not overlap the boost capacitor Cbt.

Regarding the display device according to an embodiment, at least part of the contact portion of the first connection electrode 1175 and the second electrode 3138 of the third transistor T3 may not overlap the first scan line 151. Thus, the compensation voltage transfer route CTR may avoid the portion where the second electrode 3138 of the third transistor T3 overlaps the first scan line 151. Therefore, the resistance of the compensation voltage transfer route CTR may be prevented from increasing, the compensation voltage may be smoothly transmitted, and the horizontal line defects may be reduced.

It has been described that at least part of the contact portion of the first connection electrode 1175 and the second electrode 3138 of the third transistor T3 does not overlap the first scan line 151, but the embodiments are not limited thereto. For example, at least part of the contact portion of the first connection electrode 1175 and the second electrode 3138 of the third transistor T3 does not overlap the first scan line 151 and other wires for applying a negative voltage, so identical or similar effects may be obtained.

A display device according to an embodiment will now be described with reference to FIG. 17 to FIG. 19.

The display device according to an embodiment described with reference to FIG. 17 to FIG. 19, which will not be described, mostly corresponds to the display device according to an embodiment described with reference to FIG. 1 to FIG. 11. In an embodiment, the first connection electrode does not overlap the first scan line, and at least this feature is distinguishable from the above-described embodiment(s) and will now be described.

Figure 17:
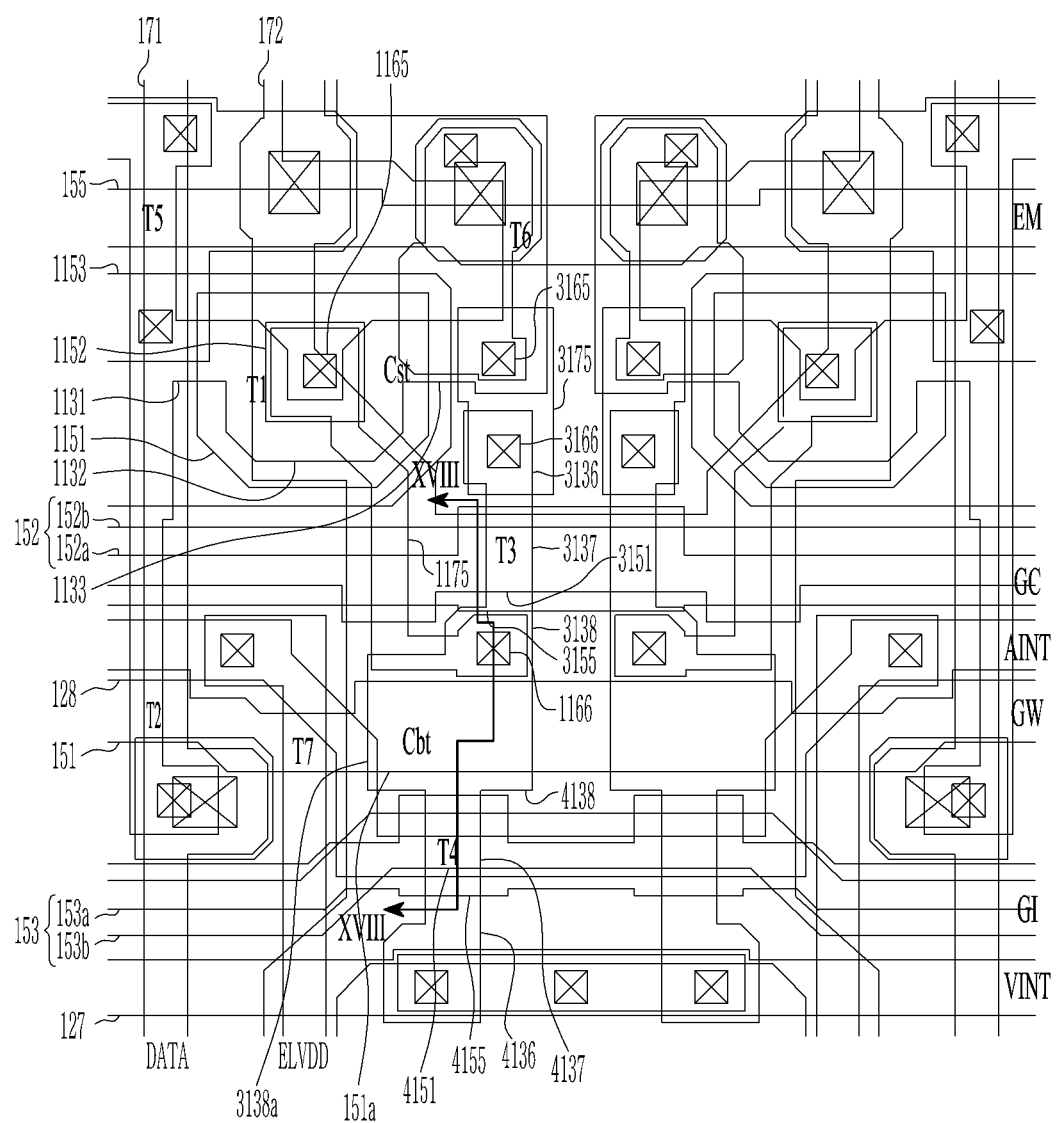
FIG. 17 shows a schematic plan view of a display device according to an embodiment.
Figure 18:
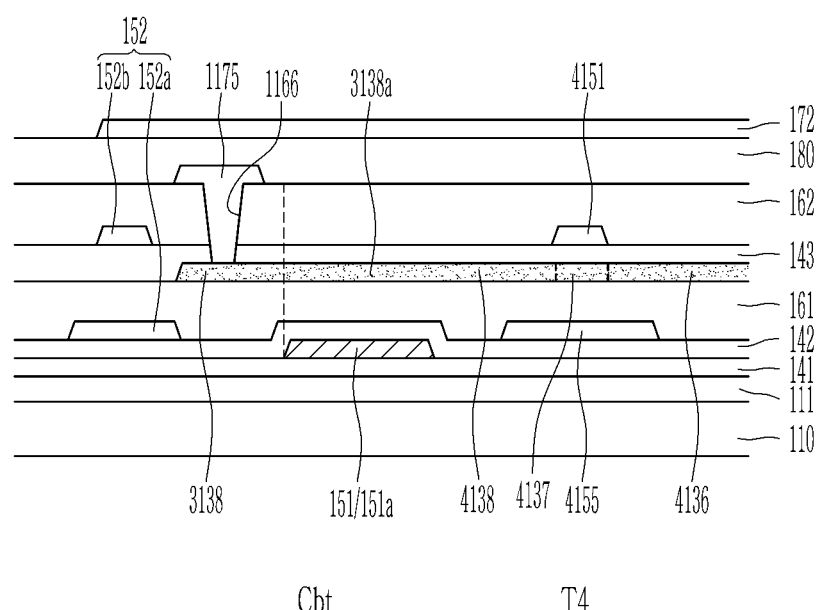
FIG. 18 shows a schematic cross-sectional view with respect to line XVIII-XVIII of FIG. 17.
Figure 19:
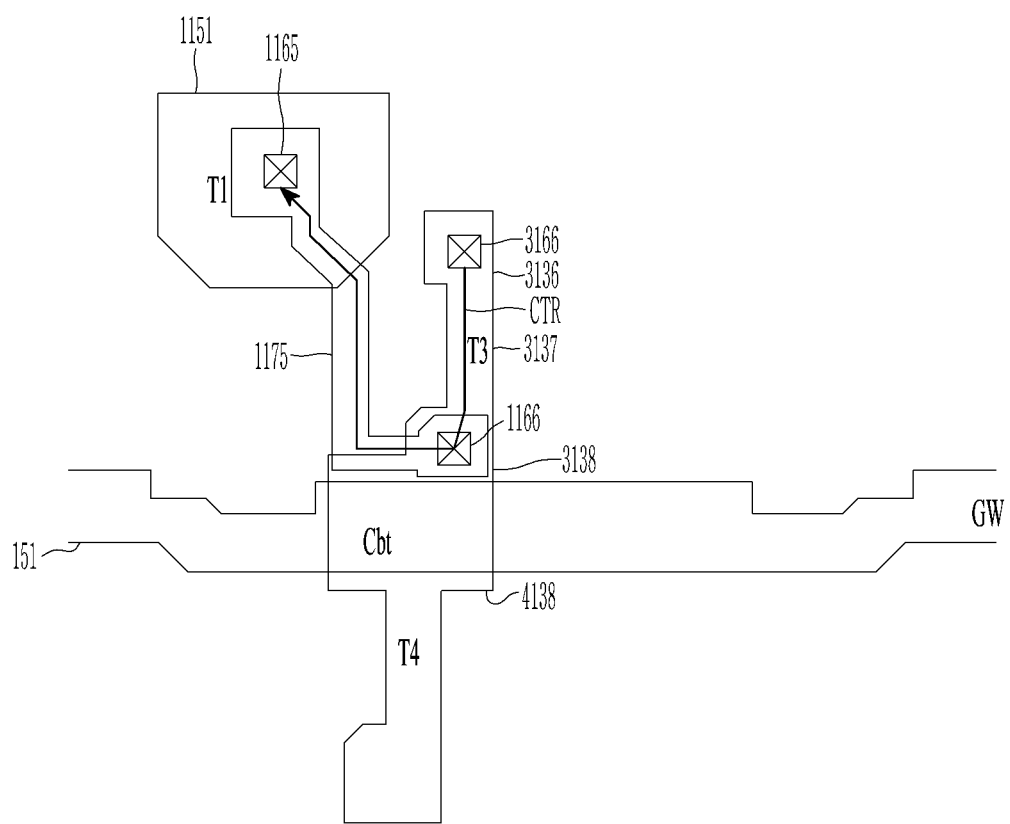
FIG. 19 shows a schematic plan view of part of a display device according to an embodiment.

FIG. 17 shows a schematic plan view of a display device according to an embodiment, FIG. 18 shows a schematic cross-sectional view with respect to line XVIII-XVIII of FIG. 17, and FIG. 19 shows a schematic plan view of part of a display device according to an embodiment.

As shown in FIG. 17 to FIG. 19, the display device according to an embodiment includes wires 127, 128, 151, 152, 153, 154, 155, 171, and 172, transistors T1, T2, T3, T4, T5, T6, and T7 electrically connected to the wires, a storage capacitor Cst, a boost capacitor Cbt, and a light emitting diode LED (not shown).

The third transistor T3 includes a first electrode 3136 electrically connected to the first electrode 1131 of the driving transistor T1, a second electrode 3138 electrically connected to the first connection electrode 1175, a channel 3137 disposed between the first electrode 3136 and the second electrode 3138, and a gate electrode 3151 overlapping the channel 3137.

A second interlayer insulating layer 162 is disposed on the gate electrode 3151 of the third transistor T3, and the second interlayer insulating layer 162 may include a first opening 1165, a second opening 1166, a third opening 3165, and a fourth opening 3166.

The second opening 1166 may overlap at least part of the second electrode 3138 of the third transistor T3. The second opening 1166 may be further included in the third gate insulating layer 143. The second opening 1166 may be disposed between the first scan line 151 and the second scan line 152 in a plan view. The second opening 1166 may not overlap the first scan line 151. The second opening 1166 may be separated from the first scan line 151. The second opening 1166 may not overlap the second scan line 152. In this instance, the second opening 1166 may not overlap the upper second scan line 152b. The second opening 1166 may not overlap the lower second scan line 152a. The second opening 1166 may not overlap the boost capacitor Cbt. For example, the second opening 1166 may not overlap the overlapping portion of the first boost electrode 151a and the second boost electrode 3138a. The second opening 1166 may be separated from the boost capacitor Cbt.

The first connection electrode 1175 may be electrically connected the second electrode 3138 of the third transistor T3 through the second opening 1166.

The first connection electrode 1175 may electrically contact the second electrode 3138 of the third transistor T3. The contact portion where the first connection electrode 1175 electrically contacts the second electrode 3138 of the third transistor T3 may be disposed in the second opening 1166. The second opening 1166 does not overlap the first scan line 151, so the contact portion of the first connection electrode 1175 and the second electrode 3138 of the third transistor T3 may not overlap the first scan line 151. The first connection electrode 1175 may not overlap the first scan line 151. The first connection electrode 1175 may be separated from the first scan line 151 with a predetermined interval therebetween. The second opening 1166 does not overlap the second scan line 152, so at least part of the contact portion of the first connection electrode 1175 and the second electrode 3138 of the third transistor T3 may not overlap the second scan line 152. The contact portion of the first connection electrode 1175 and the second electrode 3138 of the third transistor T3 may not overlap the upper second scan line 152b. The contact portion of the first connection electrode 1175 and the second electrode 3138 of the third transistor T3 may not overlap the lower second scan line 152a. The first connection electrode 1175 may not overlap the second scan line 152a. The second opening 1166 does not overlap the boost capacitor Cbt, so the contact portion of the first connection electrode 1175 and the second electrode 3138 of the third transistor T3 may not overlap the boost capacitor Cbt.

Regarding the display device according to an embodiment, the contact portion of the first connection electrode 1175 and the second electrode 3138 of the third transistor T3 may not overlap the first scan line 151, and the first connection electrode 1175 may not overlap the first scan line 151. Thus, the transfer route CTR of the compensation voltage may avoid the portion where the second electrode 3138 of the third transistor T3 overlaps the first scan line 151. Therefore, the resistance of the compensation voltage transfer route CTR may be prevented from increasing, the compensation voltage may be smoothly transmitted, and the horizontal line defects may be reduced.

It has been described in the above that the contact portion of the first connection electrode 1175 and the second electrode 3138 of the third transistor T3 does not overlap the first scan line 151, but the embodiments are not limited thereto. The contact portion of the first connection electrode 1175 and the second electrode 3138 of the third transistor T3 does not overlap the first scan line 151 and other wires for applying a negative voltage, so identical or similar effects may be obtained. Further, the first connection electrode 1175 may not overlap the first scan line 151 and other wires for applying a negative voltage.

While this disclosure has been described in connection with some embodiments, it is to be understood that the disclosure is not limited to the disclosed embodiments, but, on the contrary, is intended to cover various modifications and equivalent arrangements included within the spirit and scope of the appended claims.

What is claimed is:

1. A display device comprising:
   a light emitting diode electrically connected between a driving voltage line that applies a driving voltage and a common voltage line that applies a common voltage;
   a driving transistor electrically connected between the driving voltage line and the light emitting diode;
   a second transistor electrically connected between a first electrode of the driving transistor electrically connected to the driving voltage line and a data line that applies a data voltage;
   a first scan line electrically connected to a gate electrode of the second transistor;
   a third transistor electrically connected between a second electrode of the driving transistor electrically connected to the light emitting diode and a gate electrode of the driving transistor;
   a connection electrode that electrically connects the gate electrode of the driving transistor and the third transistor; and
   a contact portion where the connection electrode electrically contacts the third transistor,
   wherein at least a part of the contact portion does not overlap the first scan line.

2. The display device of claim 1, wherein the contact portion does not overlap the first scan line.

3. The display device of claim 2, wherein the third transistor includes:
   a first electrode electrically connected to a first electrode of the driving transistor;
   a second electrode electrically connected to the connection electrode;
   a channel disposed between the first electrode and the second electrode; and
   a gate electrode overlapping the channel, and
   the second electrode of the third transistor overlaps the connection electrode.

4. The display device of claim 3, further comprising
an insulating layer disposed between the second electrode of the third transistor and the connection electrode, wherein
the insulating layer includes an opening overlapping the second electrode of the third transistor and the connection electrode,
the second electrode of the third transistor is electrically connected to the connection electrode through the opening, and
the opening does not overlap the first scan line.

5. The display device of claim 4, wherein the contact portion is disposed in the opening.

6. The display device of claim 4, further comprising:
a second scan line electrically connected to the gate electrode of the third transistor,
wherein the opening is disposed between the first scan line and the second scan line in a plan view.

7. The display device of claim 6, wherein a side edge of the opening corresponds to a side edge of the first scan line.

8. The display device of claim 7, wherein the connection electrode overlaps the first scan line.

9. The display device of claim 6, wherein the opening is separated from the first scan line.

10. The display device of claim 9, wherein the connection electrode does not overlap the first scan line.

11. The display device of claim 6, wherein
the driving transistor and the second transistor include polycrystalline semiconductors and are p-type transistors, and
the third transistor includes an oxide semiconductor and is an n-type transistor.

12. The display device of claim 11, wherein voltages having opposite polarities are applied to the first scan line and the second scan line, respectively, at a same time.

13. The display device of claim 3, further comprising:
a boost capacitor electrically connected between the gate electrode of the second transistor and the second electrode of the third transistor,
wherein the contact portion does not overlap the boost capacitor.

14. The display device of claim 1, wherein
the contact portion includes a first part that overlaps the first scan line, and a second part that does not overlap the first scan line, and
the second part is a remaining area of the contact portion other than the first part.

15. The display device of claim 14, wherein
the third transistor includes:
a first electrode electrically connected to the first electrode of the driving transistor;
a second electrode electrically connected to the connection electrode;
a channel disposed between the first electrode and the second electrode; and
a gate electrode overlapping the channel, and
the second electrode of the third transistor overlaps the connection electrode.

16. The display device of claim 15, further comprising:
an insulating layer disposed between the second electrode of the third transistor and the connection electrode, wherein
the insulating layer includes an opening overlapping the second electrode of the third transistor and the connection electrode,
the second electrode of the third transistor is electrically connected to the connection electrode through the opening, and
the opening includes a first part that overlaps the first scan line, and a second part that does not overlap the first scan line, the second part being a remaining portion of the opening other than the first part.

17. The display device of claim 16, wherein the contact portion is disposed in the opening.

18. A display device comprising:
a driving transistor including a first electrode, a channel, and a second electrode and disposed on a substrate, the driving transistor including a polycrystalline semiconductor;
a first gate insulating layer disposed on the first electrode, the channel, and the second electrode of the driving transistor;
a gate electrode of the driving transistor disposed on the first gate insulating layer and overlapping the channel of the driving transistor;
a first scan line disposed on the first gate insulating layer;
a second gate insulating layer disposed on the gate electrode of the driving transistor and the first scan line;
a lower second scan line disposed on the second gate insulating layer;
a first interlayer insulating layer disposed on the lower second scan line;
a third transistor including a first electrode, a channel, and a second electrode, the third transistor being disposed on the first interlayer insulating layer and including an oxide semiconductor;
a third gate insulating layer disposed on the first electrode, the channel, and the second electrode of the third transistor;
a gate electrode of the third transistor disposed on the third gate insulating layer;
a second interlayer insulating layer disposed on the gate electrode of the third transistor;
a connection electrode disposed on the second interlayer insulating layer and electrically connecting the gate electrode of the driving transistor and the second electrode of the third transistor; and
a contact portion where the connection electrode electrically contacts the second electrode of the third transistor,
wherein at least a part of the contact portion does not overlap the lower second scan line.

19. The display device of claim 18, wherein
the second interlayer insulating layer and the third gate insulating layer include an opening overlapping the connection electrode and the second electrode of the third transistor,
the contact portion is disposed in the opening, and
at least a part of the opening does not overlap the first scan line.

20. The display device of claim 19, further comprising:
an upper second scan line, the upper second scan line and the gate electrode of the third transistor being integral with each other, wherein
the opening is disposed between the first scan line and the upper second scan line in a plan view, and
the opening does not overlap the upper second scan line.

21. The display device of claim 20, further comprising:
a second transistor electrically connected to the first scan line, wherein the driving transistor and the second transistor include polycrystalline semiconductors and are p-type transistors, the third transistor includes an oxide semiconductor and is an n-type transistor, and voltages having opposite polarities are applied to the first scan line and the second scan line, respectively, at a same time.

22. The display device of claim 18, further comprising:

a first boost electrode, the first boost electrode and the first scan line being integral with each other, and a second boost electrode, the second boost electrode and the second electrode of the third transistor being integral with each other, wherein the first boost electrode overlaps the second boost electrode with the second gate insulating layer and the first interlayer insulating layer being disposed between the first boost electrode and the second boost electrode to form a boost capacitor, and at least a part of the contact portion does not overlap the boost capacitor.

\* \* \* \* \*